United States Patent
Tajitsu et al.

(10) Patent No.: US 11,101,425 B2
(45) Date of Patent: Aug. 24, 2021

(54) BRAIDED PIEZOELECTRIC ELEMENT, FABRIC-LIKE PIEZOELECTRIC ELEMENT USING BRAIDED PIEZOELECTRIC ELEMENT, AND DEVICE USING SAME

(71) Applicants: TEIJIN LIMITED, Osaka (JP); KANSAI UNIVERSITY, Suita (JP)

(72) Inventors: Yoshiro Tajitsu, Suita (JP); Shunsuke Kanematsu, Osaka (JP); Yuhei Ono, Osaka (JP); Suguru Ozawa, Osaka (JP); Tomoyoshi Yamamoto, Osaka (JP); Satoko Yoshizaki, Osaka (JP)

(73) Assignees: TEIJIN LIMITED, Osaka (JP); KANSAI UNIVERSITY, Suita (JP)

( * ) Notice: Subject to any disclaimer, the term of this patent is extended or adjusted under 35 U.S.C. 154(b) by 650 days.

(21) Appl. No.: 16/066,385

(22) PCT Filed: Dec. 28, 2016

(86) PCT No.: PCT/JP2016/089149
§ 371 (c)(1),
(2) Date: Jun. 27, 2018

(87) PCT Pub. No.: WO2017/115860
PCT Pub. Date: Jul. 6, 2017

(65) Prior Publication Data
US 2018/0358541 A1    Dec. 13, 2018

(30) Foreign Application Priority Data

Dec. 28, 2015 (JP) ............................. JP2015-257504
Apr. 4, 2016 (JP) ............................. JP2016-075437

(51) Int. Cl.
*H01L 41/08* (2006.01)
*D04C 1/02* (2006.01)
(Continued)

(52) U.S. Cl.
CPC ............. *H01L 41/082* (2013.01); *D03D 1/00* (2013.01); *D03D 1/0088* (2013.01); *D03D 15/00* (2013.01);
(Continued)

(58) Field of Classification Search
CPC ............... H01L 41/082; H01L 41/1132; H01L 41/0475; H01L 41/08; G01L 1/16; H06F 3/041
See application file for complete search history.

(56) References Cited

U.S. PATENT DOCUMENTS 5,878,150 A    3/1999 Okazaki et al.
6,271,621 B1 *  8/2001 Ito ............................. G01L 1/16
                                                              310/358
(Continued)

FOREIGN PATENT DOCUMENTS

CN    1115557 A    1/1996
CN    1707934 A    12/2005
(Continued)

OTHER PUBLICATIONS

International Search Report of PCT/JP2016/089149 dated Mar. 14, 2017.

*Primary Examiner* — Bryan P Gordon
(74) *Attorney, Agent, or Firm* — Sughrue Mion, PLLC

(57) ABSTRACT

Provided is a configuration capable of improving the signal strength of a piezoelectric element using piezoelectric fibers. This braided piezoelectric element comprises a core comprising conductive fibers and a sheath comprising braided piezoelectric fibers so as to cover the core, the braided piezoelectric element further comprising a metal terminal connected and fixed to the core in either of the following states A or B. A) A state where a portion of the metal terminal grasps a fiber portion constituting the end of a braided piezoelectric element and the core and the metal (Continued)

terminal are electrically connected to each other and fixed within 1 mm from where the metal terminal grasps the fiber portion. B) A state where: a portion of the metal terminal has a fork or needle shape; the fork-shaped or needle-shaped portion is electrically connected to the core while in contact with the sheath; and the braided piezoelectric element is secured to the metal terminal by another portion of the metal terminal or a component fixed to the metal terminal within 10 mm from the point of the electrical connection.

28 Claims, 10 Drawing Sheets

(51) Int. Cl.
| | |
|---|---|
| D04C 1/12 | (2006.01) |
| D03D 15/00 | (2021.01) |
| G01L 1/16 | (2006.01) |
| G06F 3/041 | (2006.01) |
| H01L 41/193 | (2006.01) |
| D03D 1/00 | (2006.01) |
| H01L 41/113 | (2006.01) |
| H01L 41/047 | (2006.01) |
| D04B 1/00 | (2006.01) |
| D04B 21/00 | (2006.01) |
| H01L 41/04 | (2006.01) |
| H01L 41/053 | (2006.01) |

(52) U.S. Cl.
CPC ............... *D04B 1/00* (2013.01); *D04B 21/00* (2013.01); *D04C 1/02* (2013.01); *D04C 1/12* (2013.01); *G01L 1/16* (2013.01); *G06F 3/041* (2013.01); *H01L 41/042* (2013.01); *H01L 41/047* (2013.01); *H01L 41/0475* (2013.01); *H01L 41/0533* (2013.01); *H01L 41/113* (2013.01); *H01L 41/1132* (2013.01); *H01L 41/193* (2013.01); *D10B 2401/16* (2013.01)

(56) References Cited

U.S. PATENT DOCUMENTS

| | | | |
|---|---|---|---|
| 10,347,815 B1* | 7/2019 | Sleator | ................... H01L 41/042 |
| 2002/0194934 A1* | 12/2002 | Taylor | ..................... G01L 1/205 |
| | | | 73/862.046 |
| 2005/0274176 A1 | 12/2005 | Thiesen et al. | |
| 2010/0213583 A1 | 8/2010 | Oguri | |
| 2015/0261337 A1 | 9/2015 | Ando et al. | |
| 2015/0280102 A1* | 10/2015 | Tajitsu | ..................... H02N 2/18 |
| | | | 310/338 |
| 2016/0041694 A1* | 2/2016 | Ando | .................. G06F 3/04142 |
| | | | 345/177 |

FOREIGN PATENT DOCUMENTS

| | | |
|---|---|---|
| CN | 101304069 A | 11/2008 |
| CN | 101828436 A | 9/2010 |
| CN | 102097583 A | 6/2011 |
| CN | 104233579 A | 12/2014 |
| GB | 2498433 A | 7/2013 |
| JP | 2002-203996 A | 7/2002 |
| JP | 3540208 B2 | 7/2004 |
| JP | 2007-141617 A | 6/2007 |
| JP | 2007-165121 A | 6/2007 |
| JP | 2011253517 A | 12/2011 |
| KR | 10-1498417 B1 | 3/2015 |
| WO | 2014/058077 A1 | 4/2014 |
| WO | 2015/159832 A1 | 10/2015 |

* cited by examiner

BRAIDED PIEZOELECTRIC ELEMENT, FABRIC-LIKE PIEZOELECTRIC ELEMENT USING BRAIDED PIEZOELECTRIC ELEMENT, AND DEVICE USING SAME

CROSS REFERENCE TO RELATED APPLICATIONS

This application is a National Stage of International Application No. PCT/JP2016/089149 filed Dec. 28, 2016, claiming priority based on Japanese Patent Application No. 2015-257504 filed Dec. 28, 2015 and Japanese Patent Application No. 2016-075437 filed Apr. 4, 2016.

FIELD

The present invention relates to a terminal-bearing braided piezoelectric element using piezoelectric fibers, to a terminal-bearing braided piezoelectric element in which braids using piezoelectric fibers are covered with a conductive layer, to a fabric-like piezoelectric element using a terminal-bearing braided piezoelectric element, and to a device employing the same.

BACKGROUND

There has been increasing interest in recent years in regard to "wearable sensors", which have made their debut as products in the form of eyeglasses or wristwatches. However, such devices produce the sensation of being worn, and are more desirably in the form of fabrics, i.e. clothing, which are the ultimate wearable form. Piezoelectric elements using the piezoelectric effect of piezoelectric fibers are known as such types of sensors. For example, PTL 1 discloses a piezoelectric element comprising two conductive fibers and one piezoelectric fiber, with points of contact between them, while including a piezoelectric unit disposed on essentially the same plane. Also, PTL 2 discloses a piezoelectric material which is a fiber-like or molded article made of a piezoelectric polymer wherein, in order to generate piezoelectricity by tensile force applied in the axial direction, the construction includes added twists in a direction different from the direction of the tensile force that is to be applied.

On the other hand, recent years have seen a drastic increase in input devices employing touch panel systems, i.e. "touch input devices". With the development of thin display technology for bank ATMs and station ticket-vending machines, as well as smartphones, cellular phones, portable gaming devices, portable music players and the like, there has been a massive increase in devices employing touch panel systems as the input interface. Known means for realizing such touch panel systems include systems using piezoelectric sheets or piezoelectric fibers. For example, PTL 3 discloses a touch panel employing a piezoelectric sheet made of L-polylactic acid having a stretching axis oriented in a prescribed direction.

In such wearable sensors or touch panel system sensors, it is desirable to extract a high electrical signal even by small amounts of stress produced in the piezoelectric material by small deformation applied to the piezoelectric material. For example, it is desirable to stably extract a high electrical signal even by a relatively small amount of stress produced in the piezoelectric material by the movement of stretching out the finger, or the action of rubbing the surface with the finger.

The piezoelectric fiber of PTL 1 is an excellent material that can be applied for various purposes, but it cannot always output a high electrical signal in response to stress produced by relatively small amounts of deformation, nor does this publication disclose technology for obtaining a high electrical signal. Moreover, the piezoelectric element described in PTL 1 has bare conductive fibers serving as the signal wires, and therefore in order to suppress noise signals it is necessary to construct a separate noise shielding structure. Therefore, the piezoelectric element described in PTL 1 still has room for improvement toward its implementation.

The piezoelectric fibers described in PTL 2 can output an electrical signal in response to tension or compression on the piezoelectric fibers, by having the piezoelectric fibers pre-twisted via special production methods. However, PTL 2 does not disclose any technology for producing an adequate electrical signal in response to bending or stretching of the piezoelectric fibers, or shearing stress due to rubbing of the surfaces of the piezoelectric fibers. Therefore, when such piezoelectric fibers are used, it is difficult to extract a sufficient electrical signal simply by stress produced by relatively small amounts of deformation such as rubbing of the surface.

The piezoelectric sheet of PTL 3 can output an electrical signal by deformation (stress) of the piezoelectric sheet. However, because it is still in a sheet form, it has poor flexibility and cannot be used to allow free bending in the manner of a fabric.

CITATION LIST

Patent Literature

[PTL 1] International Patent Publication No. WO2014/058077
[PTL 2] Japanese Patent Publication No. 3540208
[PTL 3] Japanese Unexamined Patent Publication No. 2011-253517

SUMMARY

Technical Problem

It is an object of the invention to provide a fiber-like piezoelectric element capable of extracting a large electrical signal even by stress produced by relatively small deformation. It is another object of the invention to provide a fiber-like piezoelectric element which is the piezoelectric element described above capable of suppressing noise signals. It is yet another object of the invention to provide a terminal-bearing piezoelectric element that allows such a piezoelectric element to be efficiently connected to a signal detection circuit.

Solution to Problem

The present inventors have found that electricity can be efficiently extracted by a braided piezoelectric element as a combination of a conductive fiber and piezoelectric fibers, wherein the surface of the conductive fiber serving as the core is covered with the braided piezoelectric fibers. The present inventors have additionally found that noise signals can be further reduced by a piezoelectric element provided with a conductive layer around the periphery of such a braided piezoelectric element.

Although techniques for mounting terminals on insulation-coated conductor wires have been disclosed in the past, the conventional techniques have been found to be difficult to apply directly when connecting a terminal to a conductive fiber that has been covered in a braided fashion by piezoelectric fibers, or when connecting a terminal to a conductive fiber further provided with a conductive layer on the periphery of a piezoelectric fiber, due to the difficulty of removal of the covering, and noise arising from the properties and piezoelectricity of the sheath fibers. In addition, it has been found that with simple wiring from the ground terminal of a circuit to a surrounding conductive layer, not only is it impossible to avoid infiltration of noise at the terminal section, but the piezoelectric fibers also become loosened during complex wiring operations, and the function as a piezoelectric element tends to be lost. It has been ascertained that the problem described above can be solved by a specific structure allowing the fibers of the sheath of the connector to be anchored while ensuring electrical connection between the core and terminal, and also by a specific structure allowing the fibers of the sheath of the connector and the peripheral conductive layer to be anchored together while ensuring electrical connection of the terminals connected to core conductor wire and peripheral conductive layer, respectively.

It has also been ascertained that, for application in a wearable device, noise arising from the instability of braided piezoelectric fibers can be attenuated by reducing the distance between the terminal sections of the braided piezoelectric element and the parts anchoring the fabric or the like to a flexible base material.

Moreover, a method has been invented that allows a device with multiple braids to be efficiently formed and that allows them to be easily connected to and disconnected from circuits in order to construct a highly functional wearable device, and the present invention has thus been completed.

Specifically, the present invention encompasses the following inventions.

1. A braided piezoelectric element comprising:
a core formed of a conductive fiber, and
a sheath formed of braided piezoelectric fibers in a manner covering the core,
wherein the core of the braided piezoelectric element further comprises a metal terminal connected and fixed in either of the following states A or B, and the edge of the portion of the braided piezoelectric element that is secured by the metal terminal or a component fixed to the metal terminal has a section where piezoelectric fibers resulting by loosening of the sheath structure and separation from the core are less than 20% of the total piezoelectric fibers of the sheath.

A) A state in which a portion of the metal terminal grasps a 0.5 mm-long or greater portion of fibers constituting the end of the braided piezoelectric element, and the core and the metal terminal of the braided piezoelectric element are electrically connected to each other either directly or indirectly via a conducting material, and fixed, at the grasping portion or at a location within 1 mm from the grasping portion.

B) A state in which a portion of the metal terminal has a fork or needle shape, the fork-shaped or needle-shaped portion is connected to the conductive fiber of the core either directly or indirectly via a conducting material, while in contact with the sheath of the braided piezoelectric element, and the braided piezoelectric element is secured to the metal terminal by another portion of the metal terminal or a component fixed to the metal terminal within 10 mm from the point of the connection.

2. The braided piezoelectric element according to 1. above, wherein all or some of the piezoelectric fibers of the sheath within 5 mm from the connected portion between the core and the metal terminal have lost their fiber shapes and are fused.

3. The braided piezoelectric element according to 1 or 2 above, wherein the surface of the sheath comprises a conducting material, which is composed of solder or a conductive paste and is electrically connected to the core, the core and the metal terminal being electrically connected in an indirect manner by contact between the metal terminal and the conducting material provided on the surface of the sheath.

4. A fabric-like piezoelectric element comprising a fabric that includes a braided piezoelectric element according to any one of 1. to 3. above, wherein at least part of the braided piezoelectric element is fixed to a fabric-like base material within a length of 10 mm from the portion where the metal terminal is fixed to the braided piezoelectric element.

5. The braided or fabric-like piezoelectric element according to any one of 1. to 4. above, wherein two or more braided piezoelectric elements according to any one of 1. to 3. above are situated roughly in parallel, the two or more metal terminals respectively connected to the braided piezoelectric elements being integrated into a single connector housing and being connectable as one unit to a separate connector.

6. A fabric-like piezoelectric element having two or more braided piezoelectric elements according to 5. above situated roughly in parallel, in a portion of the yarns composing a woven fabric or knitted fabric.

7. The braided or fabric-like piezoelectric element according to any one of 1. to 6. above, wherein the piezoelectric fibers include polylactic acid as the main component, and the coiling angle of the piezoelectric fibers with respect to the conductive fibers is between 15° and 75°, inclusive.

8. The braided or fabric-like piezoelectric element according to any one of 1. to 7. above, wherein the total fineness of the piezoelectric fibers is at least 1 and no greater than 20 times the total fineness of the conductive fibers.

9. The braided or fabric-like piezoelectric element according to any one of 1. to 8. above, wherein the fineness per fiber of the piezoelectric fibers is at least $1/20$ and no greater than 2 times the total fineness of the conductive fibers.

10. The fabric-like piezoelectric element according to any one of 4. to 6. above, which further includes conductive fibers that cross and contact with at least part of the braided piezoelectric element.

11. The fabric-like piezoelectric element according to 10. above, wherein the conductive fibers constitute at least 30% of the fibers crossing the braided piezoelectric element.

12. A device comprising:
a braided or fabric-like piezoelectric element according to any one of 1. to 11. above,
amplification means that amplifies an electrical signal outputted from the braided or fabric-like piezoelectric element in response to applied pressure, and
output means that outputs the electrical signal that has been amplified by the amplification means.

13. A piezoelectric element comprising:
a core formed of a conductive fiber,
a sheath formed of braided piezoelectric fibers, covering the core, and
a conductive layer provided on the periphery of the sheath,
wherein the piezoelectric element further comprises a signal metal terminal connected and fixed to the core, and a shielding metal terminal connected and fixed to the conductive layer, the signal metal terminal and the shielding metal terminal being fixed to each other via an insulator.

14. The piezoelectric element according to 13. above, wherein the coverage factor of the sheath by the conductive layer is 25% or greater.

15. The piezoelectric element according to 13. or 14. above, wherein the conductive layer is formed of fibers.

16. The piezoelectric element according to any one of 13. to 15. above, wherein the shielding metal terminal covers and holds the signal metal terminal via an insulator.

17. The piezoelectric element according to any one of 13. to 16. above, wherein the signal metal terminal is connected and fixed in one of the following states A or B, and the edge of the portion of the piezoelectric element that is secured by the signal metal terminal or a component fixed to the signal metal terminal has a section where piezoelectric fibers resulting by loosening of the sheath structure and separation from the core are less than 20% of the total piezoelectric fibers of the sheath.

A) A state in which a portion of the signal metal terminal grasps a 0.5 mm-long or greater portion of fibers constituting the end of the piezoelectric element, and the core and the signal metal terminal of the piezoelectric element are electrically connected to each other either directly or indirectly via a conducting material, and fixed, at the grasping portion or at a location within 1 mm from the grasping portion.

B) A state in which a portion of the signal metal terminal has a fork or needle shape, the fork-shaped or needle-shaped portion is connected to the conductive fiber of the core either directly or indirectly via a conducting material, while in contact with the sheath of the piezoelectric element, and the piezoelectric element is secured to the signal metal terminal by another portion of the signal metal terminal or a component fixed to the signal metal terminal within 10 mm from the point of the connection.

18. The piezoelectric element according to any one of 13. to 17. above, wherein all or some of the piezoelectric fibers of the sheath within 5 mm from the connected portion between the core and the signal metal terminal have lost their fiber shapes and are fused.

19. The piezoelectric element according to any one of 13. to 18. above, wherein the surface of the sheath comprises a conducting material, which is composed of solder or a conductive paste and is electrically connected to the core, the core and the signal metal terminal being electrically connected in an indirect manner by contact between the signal metal terminal and the conducting material provided on the surface of the sheath.

20. A piezoelectric element comprising a fabric that includes a piezoelectric element according to any one of 13. to 19. above, wherein at least part of the piezoelectric element is fixed to a fabric-like base material within a length of 10 mm from the portion where the signal metal terminal or shielding metal terminal is fixed to the piezoelectric element.

21. The piezoelectric element according to any one of 13. to 20. above, wherein two or more piezoelectric elements according to any one of 13. to 19. above are situated roughly in parallel, the two or more signal metal terminals respectively connected to the piezoelectric elements being integrated into a single connector housing and being connectable as one unit to a separate connector.

22. The piezoelectric element according to 21. above, wherein two or more piezoelectric elements according to any one of 13. to 19. above are situated roughly in parallel as a portion of the yarns composing a woven fabric or knitted fabric.

23. The piezoelectric element according to any one of 13. to 22. above, wherein
the piezoelectric fibers include polylactic acid as the main component, and
the coiling angle of the piezoelectric fibers with respect to the conductive fibers is between 15° and 75°, inclusive.

24. The piezoelectric element according to any one of 13. to 23. above, wherein the total fineness of the piezoelectric fibers is at least 1 and no greater than 20 times the total fineness of the conductive fibers.

25. The piezoelectric element according to any one of 13. to 24. above, wherein the fineness per piezoelectric fiber is at least 1/20 and no greater than 2 times the total fineness of the conductive fibers.

26. The piezoelectric element according to any one of 20. to 22. above, which further includes conductive fibers that cross and contact with at least part of the piezoelectric element.

27. The piezoelectric element according to 26. above, wherein the conductive fibers constitute at least 30% of the fibers crossing the piezoelectric element.

28. A device comprising:
a piezoelectric element according to any one of 13. to 27. above,
amplification means that amplifies an electrical signal outputted from the piezoelectric element in response to applied pressure, and
output means that outputs the electrical signal that has been amplified by the amplification means.

Advantageous Effects of Invention

According to the invention it is possible to provide a fibrous terminal-bearing piezoelectric element capable of extracting a large electrical signal even by stress produced by relatively small deformation. According to the invention it is also possible to provide a fibrous terminal-bearing piezoelectric element which is a piezoelectric element as described above that is also capable of suppressing noise signals.

DESCRIPTION OF EMBODIMENTS (Braided Piezoelectric Element)

Figure 1:
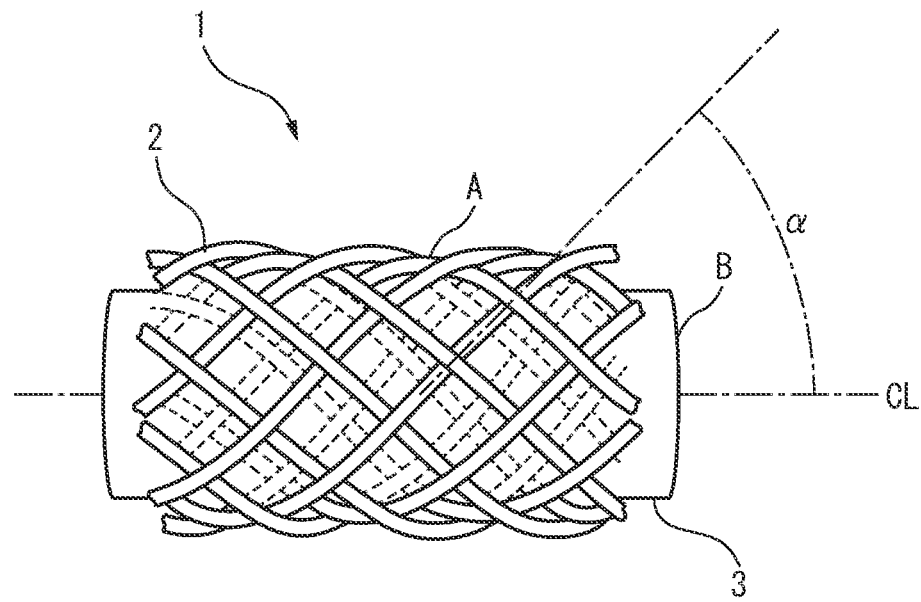
FIG. 1 is a schematic diagram showing an example of the construction of a braided piezoelectric element according to an embodiment.

FIG. 1 is a schematic diagram showing an example of the construction of a braided piezoelectric element according to an embodiment.

The braided piezoelectric element 1 comprises a core 3 formed of a conductive fiber B and a sheath 2 formed of braided piezoelectric fibers A covering the core 3. The piezoelectric fibers A may include polylactic acid as the main component.

Figure 2:
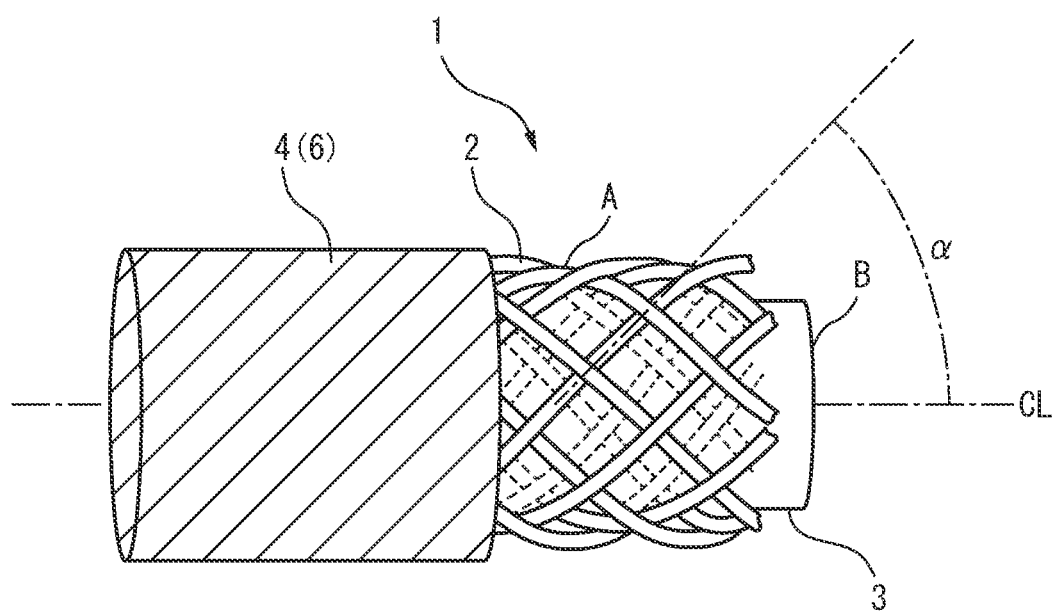
FIG. 2 is a schematic diagram showing an example of the construction of a braided piezoelectric element according to an embodiment that includes a conductive layer.

FIG. 2 is a schematic diagram showing an example of the construction of a braided piezoelectric element according to an embodiment that includes a conductive layer.

The braided piezoelectric element 1 comprises a core 3 formed of a conductive fiber B, a sheath 2 formed of braided piezoelectric fibers A covering the core 3, and a conductive layer 4 covering the sheath 2.

The coverage factor of the sheath 2 by the conductive layer 4 is preferably 25% or greater. The coverage factor referred to here is the ratio of the area of the conductive region in the conductive layer 4 when the conductive layer 4 has been projected onto the sheath 2, and the surface area of the sheath 2, the value being preferably 25% or greater, more preferably 50% or greater and even more preferably 75% or greater. If the coverage factor of the conductive layer 4 is less than 25%, the noise signal reducing effect may not be adequately exhibited. When the conductive region is not exposed on the surface of the conductive layer 4, such as when fibers encapsulating the conductive region are used as the conductive layer 4 to cover the sheath 2, the ratio of the area of the fibers projected onto the sheath 2 and the surface area of the sheath 2 may be used as the coverage factor.

The conductive region is the portion in the conductive layer 4 that is responsible for electroconductivity, and when the conductive layer 4 is composed of conductive fibers and insulating fibers, for example, it is the conductive fiber portion.

In the braided piezoelectric element 1, a plurality of piezoelectric fibers A are closely coiled around the outer peripheral surface of at least one conductive fiber B. While it is not our intention to be constrained by any particular theory, it is surmised that when deformation is produced in the braided piezoelectric element 1, stress is produced in each of the piezoelectric fibers A by the deformation, producing an electric field in each of the piezoelectric fibers A (piezoelectric effect), and as a result a voltage change takes place in the conductive fiber B, superimposing the electric field of the plurality of piezoelectric fibers A coiled around the conductive fibers B. That is, the electrical signal from the conductive fiber B is augmented compared to when the braided sheath 2 of piezoelectric fibers A is not used. This allows a large electrical signal to be extracted with the braided piezoelectric element 1, even by stress produced by relatively small deformation. Incidentally, the conductive fiber B may also consist of a plurality of fibers.

The piezoelectric fibers A preferably include polylactic acid as the main component. The term "main component" means that the most abundant component among the components of the piezoelectric fibers A is polylactic acid. The percentage of lactic acid units in the polylactic acid is preferably 90 mol % or greater, more preferably 95 mol % or greater and even more preferably 98 mol % or greater.

The coiling angle $\alpha$ of the piezoelectric fibers A with respect to the conductive fiber B is preferably between 15° and 75°, inclusive. That is, the coiling angle $\alpha$ of the piezoelectric fibers A is preferably between 15° and 75°, inclusive, with respect to the direction of the central axis CL of the conductive fiber B (core 3). For this embodiment, however, the central axis CL of the conductive fiber B overlaps with the central axis of the braid of the piezoelectric fibers A (sheath 2) (hereunder also referred to as "braid axis"), and therefore the coiling angle $\alpha$ of the piezoelectric fibers A may be considered to be preferably between 15° and 75°, inclusive, with respect to the direction of the braid axis of the piezoelectric fibers A. From the viewpoint of extracting an even larger electrical signal, the angle $\alpha$ is preferably between 25° and 65°, inclusive, more preferably between 35° and 55°, inclusive and even more preferably between 40° and 50°, inclusive. If the angle $\alpha$ is outside of the angle range, the electric field generated in the piezoelectric fibers A will be notably reduced, thereby notably reducing the electrical signal obtained by the conductive fiber B.

The angle $\alpha$ may also be considered to be the angle formed between the main direction of the piezoelectric fibers A forming the sheath 2 and the central axis CL of the conductive fiber B, and some of the piezoelectric fibers A may even be relaxed or fluffed.

The reason for the notable reduction in the electric field produced in the piezoelectric fibers A is as follows. The piezoelectric fibers A are composed mainly of polylactic acid, and are uniaxially oriented in the direction of the fiber axis of the piezoelectric fibers A. Polylactic acid produces an electric field when subjected to shearing stress with respect to the orientation direction (in this case, the direction of the fiber axis of the piezoelectric fibers A), but produces little electric field when subjected to tensile stress or compression stress with respect to the orientation direction. Consequently, in order to produce shearing stress on the piezoelectric fibers A under deformation parallel to the direction of the braid axis, it is thought to be desirable for the orientation direction of the piezoelectric fibers A (polylactic acid) to be in a prescribed angle range with respect to braid axis.

In the braided piezoelectric element 1, so long as the object of the invention is achieved, combined filaments may be prepared in combination with fibers other than the piezoelectric fibers A for the sheath 2, and combined filaments may be prepared in combination with fibers other than the conductive fiber B for the core 3.

There are no particular restrictions on the length of the braided piezoelectric element composed of the core 3 of the conductive fiber B and the sheath 2 of the braided piezoelectric fibers A, or the braided piezoelectric element composed of the core 3 of the conductive fiber B, the sheath 2 of the braided piezoelectric fibers A and the conductive layer 4 covering the sheath 2. For example, the braided piezoelectric element may be produced in a continuous manner during production, and cut to the necessary length afterwards for use. The length of the braided piezoelectric element is 1 mm to 10 m, preferably 5 mm to 2 m and more preferably 1 cm to 1 m. If the length is too short the convenience of the fiber shape may be lost, and if the length is too long it may become necessary to consider the resistance value of the conductive fiber B.

Each of the structural aspects will now be explained in greater detail.

(Conductive Fiber)

The conductive fiber B used may be any publicly known one that exhibits conductivity. Examples for the conductive fiber B include metal fibers, fibers made of conductive polymers, carbon fibers, fibers made of polymers dispersing fibrous or granular conductive fillers, or fibers forming a layer with conductivity on the surface of a fibrous substance. The method of forming a layer with conductivity on the surface of a fibrous substance may be metal coating, conductive polymer coating or conductive fiber coiling. Metal coating is preferred among these from the viewpoint of conductivity, durability, flexibility and the like. The specific method of coating a metal may be vapor deposition, sputtering, electrolytic plating, electroless plating or the like, with plating being preferred from the viewpoint of productivity. Fibers that have been metal-plated in this manner may be considered to be metal-plated fibers.

The base fiber that has been coated with a metal may be a publicly known fiber, regardless of the presence or absence of conductivity, examples of which include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. The base fiber is not limited to these and any publicly known fiber may be used, or combinations of these fibers may be used.

The metal to be coated onto the base fiber may be any type that exhibits conductivity and exhibits the effect of the invention. Examples to be used include gold, silver, platinum, copper, nickel, tin, zinc, palladium, indium tin oxide, copper sulfide and the like, as well as their mixtures and alloys.

When an organic fiber coated with a metal with bending resistance is used as the conductive fiber B, the conductive fiber will be very highly unlikely to break and the durability and safety of a sensor using the piezoelectric element will be excellent.

The conductive fiber B may be a multifilament consisting of a bundle of multiple filaments, or a monofilament consisting of a single filament. The conductive fiber B may be a single spun yarn, or a fiber bundle comprising a plurality of spun yarns that have been bundled (including twisted yarn), or a long/short composite yarn comprising a blend of filament and spun yarn. A multifilament is preferred from the viewpoint of the long-term stability of the electrical characteristics. In the case of a monofilament or single spun yarn, the monofilament diameter is 1 µm to 5000 µm and preferably 2 µm to 100 µm. It is more preferably 3 µm to 50 µm. In the case of a multifilament, fiber bundle or long/short composite yarn, the number of filaments or yarns is preferably from 1 to 100,000, more preferably 5 to 500 and even more preferably 10 to 100. The fineness and number of filaments of the conductive fiber B is the fineness and number of filaments of the core 3 used to form the braid, and whether in the case of a multifilament formed of multiple single threads (monofilaments), or a fiber bundle formed by bundling multiple spun yarns (including twisted yarn), or long/short composite yarn comprising a blend of filament and spun yarn, these are all counted as a single conductive fiber B. The core 3 is the overall amount, including fibers other than conductive fibers when they are used.

If the diameter of the fiber is small the strength will be reduced and handling may become difficult, while if the diameter is large there may be some sacrifice of flexibility. The cross-sectional shape of the conductive fiber B is preferably circular or elliptical from the viewpoint of design and production of the piezoelectric element, but this is not limitative.

Moreover, a lower electrical resistance is preferred for efficient extraction of electrical output from the piezoelectric polymer, the volume resistivity being preferably no greater than $10^{-1}$ Ω·cm, more preferably no greater than $10^{-2}$ Ω·cm and even more preferably no greater than $10^{-3}$ Ω·cm. However, the resistivity of the conductive fiber B is not limited thereto so long as sufficient strength can be obtained for detection of the electrical signal.

For use according to the present invention, the conductive fiber B must be resistant to movements such as repeated bending and twisting. As one indicator, a larger knot tenacity is preferred. The knot tenacity can be measured by the method of JIS L1013:2010 8.6. The degree of knot tenacity suitable for the invention is preferably 0.5 cN/dtex or greater, more preferably 1.0 cN/dtex or greater, even more preferably 1.5 cN/dtex or greater and most preferably 2.0 cN/dtex or greater. As another indicator, low flexural rigidity is preferred. Flexural rigidity is generally measured with a measuring apparatus such as a KES-FB2 Pure Bending Tester by Kato Tech Corp. The degree of flexural rigidity suitable for the invention is preferably lower than the carbon fibers TENAX® HTS40-3K by Toho Tenax Co., Ltd. Specifically, the flexural rigidity of the conductive fiber is preferably no greater than $0.05 \times 10^{-4}$ N·m²/m, more preferably no greater than $0.02 \times 10^{-4}$ N·m²/m and even more preferably no greater than $0.01 \times 10^{-4}$ N·m²/m.

(Piezoelectric Fibers)

The piezoelectric polymer used as the material for the piezoelectric fibers A may be a polymer exhibiting piezoelectricity such as polyvinylidene fluoride or polylactic acid, but the piezoelectric fibers A described above for this embodiment preferably include polylactic acid as the main component. Polylactic acid is readily oriented and exhibits piezoelectricity by stretching after melt spinning, for example, and has excellent productivity since it does not require electric field orientation treatment as is necessary with polyvinylidene fluoride and the like. However, this is not intended to exclude the use of polyvinylidene fluoride and other piezoelectric materials for carrying out the present invention.

Polylactic acid includes poly-L-lactic acid obtained by polymerization of L-lactic acid and L-lactide, poly-D-lactic acid obtained by polymerization of D-lactic acid and D-lactide, and stereocomplex polylactic acid comprising a hybrid structure of these, depending on the crystal structure, and any of these may be used so long as they exhibit piezoelectricity. Poly-L-lactic acid and poly-D-lactic acid are preferred from the viewpoint of a high piezoelectric modulus. Since poly-L-lactic acid and poly-D-lactic acid exhibit opposite polarization against the same stress, they may be used in combination according to the purpose.

The optical purity of polylactic acid is preferably 99% or greater, more preferably 99.3% or greater and even more preferably 99.5% or greater. If the optical purity is less than 99% the piezoelectric modulus may be significantly lowered, potentially making it difficult to obtain a sufficient electrical signal by shape deformation of the piezoelectric fibers A. In particular, the piezoelectric fibers A include poly-L-lactic acid or poly-D-lactic acid as the main component, preferably with an optical purity of 99% or greater.

Piezoelectric fibers A composed mainly of polylactic acid are stretched during production, and are uniaxially oriented in their fiber axis direction. Furthermore, preferably the piezoelectric fibers A are not only uniaxially oriented in the fiber axis direction but also include polylactic acid crystals, and more preferably they include uniaxially oriented polylactic acid crystals. This is because polylactic acid exhibits higher piezoelectricity by having high crystallinity and being uniaxially oriented.

The crystallinity and uniaxial orientation are determined by the homo PLA crystallinity $X_{homo}$ (%) and crystal orientation Ao (%). The piezoelectric fibers A of the invention preferably have a homo PLA crystallinity $X_{homo}$ (%) and crystal orientation Ao (%) satisfying the following inequality (1).

$$X_{homo} \times Ao \times Ao \div 10^6 \geq 0.26 \quad (1)$$

If inequality (1) is not satisfied, the crystallinity and/or uniaxial orientation will be insufficient, the output value of the electrical signal for operation may be reduced and the sensitivity of the signal for operation in a specific direction may be reduced. The value of the left side of inequality (1) is more preferably 0.28 or greater, and more preferably 0.3 or greater. Each of the values is determined in the following manner.

Homopolylactic Acid Crystallinity $X_{homo}$:

The homopolylactic acid crystallinity $X_{homo}$ is determined from crystal structure analysis by wide-angle X-ray diffraction (WAXD). In wide-angle X-ray diffraction (WAXD), an Ultrax18 X-ray diffraction apparatus by Rigaku Corp. is used in a transmission method, and the X-ray diffraction pattern of a sample is recorded on an imaging plate under the following conditions.

X-ray source: Cu—Kα rays (confocal mirror)
Output: 45 kV×60 mA
Slits: 1st: 1 mmΦ, 2nd: 0.8 mmΦ
Camera length: 120 mm
Elapsed time: 10 minutes
Sample: 35 mg of polylactic acid fibers are aligned to form a 3 cm fiber bundle.

The total scattering intensity $I_{total}$ over the declination in the obtained X-ray diffraction pattern is determined, and the sum $\Sigma I_{HMi}$ of the integrated intensity for each diffraction peak attributed to homopolylactic acid crystals, appearing near 2θ=16.5°, 18.5° and 24.3°, is calculated. Based on these values, the homopolylactic acid crystallinity $X_{homo}$ is calculated by the following formula (2).

$$\text{Homopolylactic acid crystallinity } X_{homo} \text{ (\%)} = \Sigma I_{HMi} / I_{total} \times 100 \quad (2)$$

The value of $\Sigma I_{HMi}$ is calculated by subtracting the background and amorphous diffuse scattering from the total scattering intensity.

(2) Crystal Orientation Ao:

In the X-ray diffraction pattern obtained by the aforementioned wide-angle X-ray diffraction (WAXD), the crystal orientation Ao has an intensity distribution with respect to the declination (°) for the diffraction peaks attributable to homopolylactic acid crystals, appearing near 2θ=16.5° in the radius vector direction, and it is calculated from the sum $\Sigma_{Wi}$ (°) of the half-widths in the obtained distribution profile, using the following formula (3).

$$\text{Crystal orientation } Ao = (360 - \Sigma W_i) \div 360 \times 100 \quad (3)$$

Incidentally, since polylactic acid is a polyester with relatively rapid hydrolysis, a publicly known hydrolysis preventer such as an isocyanate compound, oxazoline compound, epoxy compound or carbodiimide compound may be added when resistance to moist heat is an issue. Also, if necessary, an antioxidant, plasticizer, photodegradation inhibitor or the like such as a phosphoric acid-based compound may be added to modify the physical properties.

Moreover, polylactic acid may be used as an alloy with another polymer, in which case if polylactic acid is to be used as the main piezoelectric polymer, the amount of the polylactic acid is preferably at least 50 mass % or greater, more preferably 70 mass % or greater and most preferably 90 mass % or greater, based on the total weight of the alloy.

In the case of an alloy, suitable examples of polymers other than polylactic acid include polybutylene terephthalate, polyethylene terephthalate, polyethylene naphthalate copolymer and polymethacrylate, with no limitation to these, and any polymer may be used so long as the piezoelectricity that is the object of the invention is exhibited.

The piezoelectric fibers A may be multifilaments comprising a bundle of a plurality of filaments, or a monofilaments composed of single filaments, or they may be single spun yarns, or fiber bundles comprising a plurality of spun yarns that have been bundled (including twisted yarn), or long/short composite yarns comprising a blend of filaments and spun yarns. In the case of monofilaments or single spun yarns, the monofilament diameter is 1 µm to 5 mm, preferably 5 µm to 2 mm and even more preferably 10 µm to 1 mm. In the case of multifilaments, the monofilament diameter is 0.1 µm to 5 mm, preferably 2 µm to 100 µm and even more preferably 3 µm to 50 µm. In the case of multifilaments, fiber bundles or long/short composite yarns, the number of filaments or yarns is preferably from 1 to 100,000, more preferably 50 to 50,000 and even more preferably 100 to 20,000. However, the fineness and number of piezoelectric fibers A is the fineness and number per carrier when preparing the braid, and a multifilament formed of a plurality of single threads (monofilaments) is counted as one piezoelectric fiber A. One carrier includes the overall amount, including fibers other than piezoelectric fibers when they are used.

In order to obtain piezoelectric fibers A from such a piezoelectric polymer, any publicly known method for forming fibers from a polymer may be employed so long as the effect of the invention is exhibited. For example, a method of forming fibers by extrusion molding of the piezoelectric polymer, a method of forming fibers by melt spinning of the piezoelectric polymer, a method of forming fibers by dry or wet spinning of the piezoelectric polymer, a method of forming fibers by electrostatic spinning of the piezoelectric polymer, or a method of forming a film and then finely cutting it, may be employed. The spinning conditions employed may be according to a publicly known process suitable for the piezoelectric polymer used, and for most cases a melt spinning process may be employed, which facilitates industrial production. After formation of the fibers, the formed fibers may also be stretched. This will form piezoelectric fibers A that are uniaxially stretched and oriented, include crystals, and exhibit high piezoelectricity.

In addition, the piezoelectric fibers A may be treated by dyeing, twisting, doubling, heat treatment or the like, before braiding of the fibers prepared as described above.

In addition, since the piezoelectric fibers A will sometimes become twisted together or broken, or produce fluff, during formation of the braid, their strength and abrasion resistance is preferably high, the strength being preferably 1.5 cN/dtex or greater, more preferably 2.0 cN/dtex or greater, even more preferably 2.5 cN/dtex or greater and most preferably 3.0 cN/dtex or greater. The abrasion resistance can be evaluated by JIS L1095 9.10.2, Method B, with an abrasion pass count of preferably 100 or greater, more preferably 1000 or greater, even more preferably 5000 or greater and most preferably 10,000 or greater. The method of increasing the abrasion resistance is not particularly restricted, and any publicly known method may be used, such as increasing the degree of crystallinity, adding fine particles, or surface processing. Abrasion can also be reduced by coating the fibers with a lubricating agent during processing of the braid.

Also, the difference in the shrinkage factor of the piezoelectric fibers is preferably small compared to the shrinkage factor of the conductive fiber mentioned above. If the difference in shrinkage factors is large, the braid may bend or the fabric may lose flatness in the post-treatment steps after formation of the braid or after formation of the fabric, or when subjected to heat or with passage of time during actual use, often resulting in a weaker piezoelectric signal. When the shrinkage factor has been quantified by the boiling water shrinkage ratio as described below, the boiling water shrinkage ratio of the piezoelectric fibers $S(p)$ and the boiling water shrinkage ratio of the conductive fiber $S(c)$ preferably satisfy the following inequality (4).

$$|S(p)-S(c)|\leq 10 \quad (4)$$

The left side of inequality (4) is more preferably $\leq 5$ and even more preferably $\leq 3$.

The difference in the shrinkage factor of the piezoelectric fibers is also preferably small compared to the shrinkage factor of fibers other than the conductive fiber, such as insulating fibers. If the difference in shrinkage factors is large, the braid may bend or the fabric may lose flatness in the post-treatment steps after formation of the braid or after formation of the fabric, or when subjected to heat or with passage of time during actual use, often resulting in a weaker piezoelectric signal. When the shrinkage factor has been quantified by the boiling water shrinkage ratio, the boiling water shrinkage ratio of the piezoelectric fibers $S(p)$ and the boiling water shrinkage ratio of the insulating fibers $S(i)$ preferably satisfy the following inequality (5).

$$|S(p)-S(i)|\leq 10 \quad (5)$$

The left side of inequality (5) is more preferably $\leq 5$ and even more preferably $\leq 3$.

The shrinkage factor of the piezoelectric fibers is also preferably small. For example, when the shrinkage factor has been quantified by the boiling water shrinkage ratio, the shrinkage factor of the piezoelectric fibers is preferably no greater than 15%, more preferably no greater than 10%, even more preferably no greater than 5% and most preferably no greater than 3%. The means used to lower the shrinkage factor may be any publicly known method, and for example, the shrinkage factor can be lowered by heat treatment to relax the orientation of the amorphous sections or to increase the degree of crystallinity, without any particular restrictions on the timing of heat treatment, which may be after stretching, after twisting, after braiding or after fabric formation. The boiling water shrinkage ratio described above was measured by the following method. A reel with 20 coils was prepared using a sizing reel having a frame circumference of 1.125 m, a 0.022 cN/dtex load was applied, it was suspended from a scale board, and the initial reel length L0 was measured. The reel was then treated for 30 minutes in a boiling water bath at 100° C. and allowed to cool, a load was again applied, it was suspended from the scale board, and the contracted reel length L was measured. The measured L0 and L values were used to calculate the boiling water shrinkage ratio by the following formula (6).

$$\text{Boiling water shrinkage ratio}=(L0-L)/L0\times 100(\%) \quad (6)$$

(Covering)

The conductive fiber B, i.e. the core 3, has its surface covered by the piezoelectric fibers A, i.e. the braided sheath 2. The thickness of the sheath 2 covering the conductive fiber B is preferably 1 μm to 10 mm, more preferably 5 μm to 5 mm, even more preferably 10 μm to 3 mm and most preferably 20 μm to 1 mm. If it is too thin, problems may result in terms of strength, and if it is too thick, the braided piezoelectric element 1 may become hard and more resistant to deformation. The "sheath 2" referred to here is the layer adjacent to the core 3.

In the braided piezoelectric element 1, the total fineness of the piezoelectric fibers A of the sheath 2 is preferably at least ½ and no greater than 20 times, more preferably at least 1 and no greater than 15 times, and even more preferably at least 2 and no greater than 10 times, the total fineness of the conductive fiber B of the core 3. If the total fineness of the piezoelectric fibers A is too small with respect to the total fineness of the conductive fiber B, there will be too few piezoelectric fibers A surrounding the conductive fiber B and the conductive fiber B will not be able to sufficiently output an electrical signal, while the conductive fiber B may potentially contact with other adjacent conductive fibers. If the total fineness of the piezoelectric fibers A is too large with respect to the total fineness of the conductive fiber B, there will be too many piezoelectric fibers A surrounding the conductive fiber B, and the braided piezoelectric element 1 will become too hard and resistant to deformation. In other words, the braided piezoelectric element 1 will fail to adequately function as a sensor in both cases.

The total fineness referred to here is the sum of all of the finenesses of the piezoelectric fibers A composing the sheath 2, and in the case of a common 8-strand braid, for example, it is the sum of the finenesses of the 8 strands.

Also, in the braided piezoelectric element 1, the fineness per piezoelectric fiber A of the sheath 2 is preferably at least 1/20 and no greater than 2 times, more preferably at least 1/15 and no greater than 1.5 times, and even more preferably at least 1/10 and no greater than 1 times, the total fineness of the conductive fiber B, if the fineness per piezoelectric fiber A is too small with respect to the total fineness of the conductive fiber B, there will be too few piezoelectric fibers A and the conductive fiber B will not be able to sufficiently output an electrical signal, while the piezoelectric fibers A may potentially undergo breakage. If the fineness per piezoelectric fiber A is too large with respect to the total fineness of the conductive fiber B, the piezoelectric fibers A will be too thick and the braided piezoelectric element 1 will become too hard and resistant to deformation. In other words, the braided piezoelectric element 1 will fail to adequately function as a sensor in both cases.

Incidentally, when metal fiber is used for the conductive fiber B or when metal fiber is combined with the conductive fiber A or piezoelectric fibers B, the fineness proportion is not limited to that mentioned above. This is because according to the invention, the proportion is important from the standpoint of the contact area and coverage factor, i.e. the area and volume. For example, if the specific gravity of each of the fibers exceeds 2, the proportion of the mean cross-sectional area of the fibers is preferably the same as the fineness proportion.

It is preferred for the piezoelectric fibers A and the conductive fiber B to be as closely bonded as possible, but for improved adhesiveness, an anchor layer or adhesive layer may be provided between the conductive fiber B and the piezoelectric fibers A.

The covering method employed is a method of using the conductive fiber B as the core thread and coiling the piezoelectric fibers A in a braided fashion around it. On the other hand, the form of the braid of the piezoelectric fibers A is not particularly restricted so long as an electrical signal can be outputted in response to stress produced by an applied load, but it is preferably an 8-strand braid or a 16-strand braid with the core 3.

The form of the conductive fiber B and the piezoelectric fibers A is not particularly restricted, but they are preferably as nearly concentric as possible. When a multifilament is used as the conductive fiber B, the piezoelectric fibers A need only be covering in a manner so that at least a portion of the surface of the multifilament of the conductive fiber B (the peripheral surface of the fiber) is contacting, and the piezoelectric fibers A may cover all, or not all, of the filament surfaces (peripheral surfaces of the fibers) of the multifilament. The covering state of the piezoelectric fibers A on each filament in the interior forming the multifilament of the conductive fiber B may be set as appropriate, in consideration of performance and handleability of the piezoelectric element.

Since the braided piezoelectric element 1 of the invention has no need for electrodes on its surface, there is no need to further cover the braided piezoelectric element 1 itself, while it also has the advantage of being less likely to malfunction.

(Conductive Layer)

The state of the conductive layer 4 may be a coating, or a film, fabric or fiber coil, or even a combination of these.

A coating used to form the conductive layer 4 need only include a substance that exhibits conductivity, and various publicly known substances may be used. Examples include metals, conductive polymers or polymers dispersing conductive fillers.

When the conductive layer 4 is to be formed by coiling a film, the film used is obtained by forming a film of a conductive polymer and a polymer dispersing a conductive filler, or the film used may have a conductive layer formed on the surface.

When the conductive layer 4 is to be formed by coiling a fabric, the fabric used has the conductive fiber 6 described below as the constituent component.

When the conductive layer 4 is to be formed by coiling a fiber, the method of coiling may be as a cover ring, knitted fabric, braid or the like. The fiber used is a conductive fiber 6, and the conductive fiber 6 may be of the same type as the conductive fiber B mentioned above or a different type of conductive fiber. Examples for the conductive fiber 6 include metal fibers, fibers made of conductive polymers, carbon fibers, fibers made of polymers dispersing fibrous or granular conductive fillers, or fibers forming a layer with conductivity on the surface of a fibrous substance. The method of forming a layer with conductivity on the surface of a fibrous substance may be metal coating, conductive polymer coating or conductive fiber coiling. Metal coating is preferred among these from the viewpoint of conductivity, durability, flexibility and the like. The specific method of coating a metal may be vapor deposition, sputtering, electrolytic plating, electroless plating or the like, with plating being preferred from the viewpoint of productivity. Fibers that have been metal-plated in this manner may be considered to be metal-plated fibers.

The base fiber that has been coated with a metal may be a publicly known fiber, regardless of the presence or absence of conductivity, examples of which include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and cupra. The base fiber is not limited to these, and any publicly known fiber may be used or combinations of these fibers may be used.

The metal to be coated onto the base fiber may be any type that exhibits conductivity and exhibits the effect of the invention. Examples to be used include gold, silver, platinum, copper, nickel, tin, zinc, palladium, indium tin oxide, copper sulfide and the like, as well as their mixtures and alloys.

When an organic fiber coated with a metal with bending resistance is used as the conductive fiber 6, the conductive fiber is very highly unlikely to break, and the durability and safety of a sensor using the piezoelectric element will be excellent.

The conductive fiber 6 may be a multifilament comprising a bundle of a plurality of filaments, or a monofilament composed of a single filament, or they may be a single spun yarn, or a fiber bundle comprising a plurality of spun yarns that have been bundled (including twisted yarn), or a long/short composite yarn comprising a blend of filament and spun yarn. A multifilament is preferred from the viewpoint of the long-term stability of the electrical characteristics. In the case of a monofilament or single spun yarn, the monofilament diameter is 1 μm to 5000 μm and preferably 2 μm to 100 μm. It is more preferably 3 μm to 50 μm. In the case of a multifilament, fiber bundle or long/short composite yarn, the number of filaments or yarns is preferably from 1 to 100,000, more preferably 5 to 500 and even more preferably 10 to 100.

If the diameter of the fiber is small the strength will be reduced and handling may become difficult, while if the diameter is large there may be some sacrifice of flexibility. The cross-sectional shape of the conductive fiber 6 is preferably circular or elliptical from the viewpoint of design and production of the piezoelectric element, but this is not limitative.

Moreover, lower electrical resistance is preferred for an increased effect of suppressing noise signals, the volume resistivity being preferably no greater than $10^{-1}$ Ω·cm, more preferably no greater than $10^{-2}$ Ω·cm and even more preferably no greater than $10^{-3}$ Ω·cm. However, the resistivity is not limited to this range so long as the effect of suppressing noise signals can be obtained.

For use according to the present invention, the conductive fiber 6 must be resistant to movements such as repeated bending and twisting. As one indicator, a larger knot tenacity is preferred. The knot tenacity can be measured by the method of JIS L1013 8.6. The degree of knot tenacity suitable for the invention is preferably 0.5 cN/dtex or greater, more preferably 1.0 cN/dtex or greater, even more preferably 1.5 cN/dtex or greater and most preferably 2.0 cN/dtex or greater. As another indicator, low flexural rigidity is preferred. Flexural rigidity is generally measured with a measuring apparatus such as a KES-FB2 Pure Bending Tester by Kato Tech Corp. The degree of flexural rigidity suitable for the invention is preferably lower than the carbon fibers TENAX® HTS40-3K by Toho Tenax Co., Ltd. Specifically, the flexural rigidity of the conductive fiber is preferably no greater than $0.05 \times 10^{-4}$ N·m²/m, more preferably no greater than $0.02 \times 10^{-4}$ N·m²/m and even more preferably no greater than $0.01 \times 10^{-4}$ N·m²/m.

(Terminal)

The braided piezoelectric element 1 of the invention further comprises a metal terminal connected and fixed to the core, in one of the following states A or B.

A) A state in which a portion of the metal terminal grasps a 0.5 mm-long or greater portion of fibers constituting the end of the braided piezoelectric element, and the core and the metal terminal of the braided piezoelectric element are connected and fixed to each other either directly or indirectly via a conducting material, at the grasping portion or at a location within 1 mm from the grasping portion.

B) A state in which a portion of the metal terminal has a fork or needle shape, the fork-shaped or needle-shaped portion is connected to the conductive fiber of the core either directly or indirectly via a conducting material, while in contact with the sheath of the braided piezoelectric element, and the braided piezoelectric element is secured to the metal terminal by another portion of the metal terminal or a component fixed to the metal terminal within 10 mm from the point of the connection.

Furthermore, the braided piezoelectric element 1 of the invention further comprises a signal metal terminal connected and fixed to the core and a shielding metal terminal connected and fixed to the conductive layer 4 provided on the periphery of the sheath, the signal metal terminal and shielding metal terminal being fixed to each other via an insulator, and since the two metal terminals are treated as an integral connector component, it is possible to conveniently and reliably form connection to the circuit that is to process the signal, and to stably reduce noise.

Furthermore, the shielding metal terminal preferably covers and holds the signal metal terminal via an insulator, from the viewpoint of reducing infiltrating noise at the terminal section. The term "cover" used here means that the shielding metal terminal is situated adjacent to the signal metal terminal, and when projected onto front view, rear view, left side view, right side view, plan view and bottom view images in that state, the proportion of the area in which the region of the shielding metal terminal overlaps is at least 50% of the total area of the region of the signal metal terminal, in each image. An opening or insulator may also be provided as necessary for connection between a different terminal and the signal metal terminal.

The signal metal terminal of the braided piezoelectric element 1 of the invention is preferably connected and fixed to the core, in one of the following states A or B.

A) A state in which a portion of the signal metal terminal grasps a 0.5 mm-long or greater portion of fibers constituting the end of the braided piezoelectric element, and the core and the signal metal terminal of the braided piezoelectric element are connected and fixed to each other either directly or indirectly via, a conducting material, at the grasping portion or at a location within 1 mm from the grasping portion.

B) A state in which a portion of the signal metal terminal has a fork or needle shape, the fork-shaped or needle-shaped portion is connected to the conductive fiber of the core either directly or indirectly via a conducting material, while in contact with the sheath of the braided piezoelectric element, and the braided piezoelectric element is secured to the signal metal terminal by another portion of the signal metal terminal or a component fixed to the signal metal terminal within 10 mm from the point of the connection.

(Connection by State A)

Figure 3:
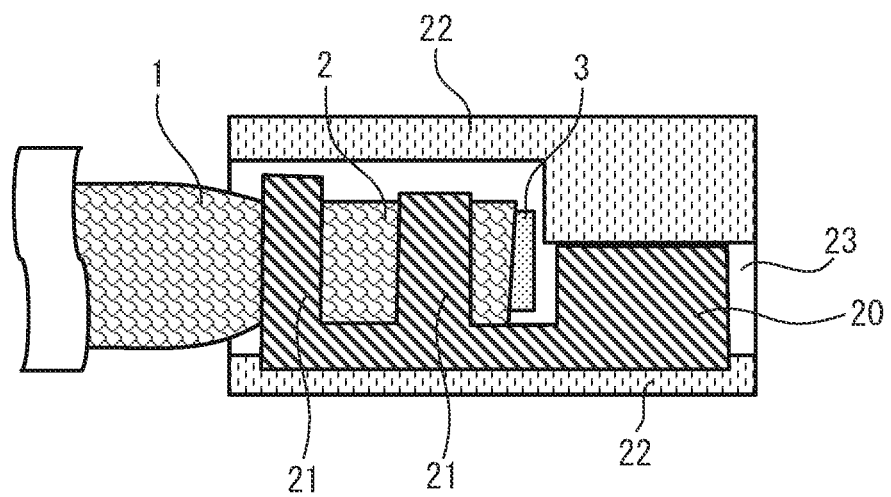
FIG. 3 is a schematic diagram showing an example of connecting a braided piezoelectric element and a metal terminal, according to an embodiment (state A).

FIG. 3 (state A) is a schematic diagram showing an example of the construction of the A state of connection, for this embodiment.

The piezoelectric fibers and conductive fiber composing the end of the braided piezoelectric element 1 are grasped by the grasping portion 21, as part of the metal terminal 20. A grasped state means that the braided piezoelectric element 1 is sandwiched or wrapped by the grasping portion 21 of the metal terminal 20 so that they are mutually fixed. It is preferred to employ a structure in which the metal terminal 20 cast into the shape of a hook is in the grasped state described above by plastic deformation using a tool. The metal terminal has a shape that allows it to be connected to a different terminal on the right side in FIG. 3.

The grasping portion 21 of the metal terminal 20 has a length of 0.5 mm or greater, because if it is shorter than this length, fixing between the braided piezoelectric element 1 and the metal terminal 20 may be weak, and when different force levels are applied to the element, such as with application in a wearable device, the braided piezoelectric element 1 and metal terminal 20 may become separated or the electrical connection may become unstable. The length of the grasping portion 21 is preferably 0.7 mm or greater and more preferably 1.0 mm or greater. The length of the grasping portion 21 is the length along which the metal terminal 20 grasps the braided piezoelectric element 1, measured in the lengthwise direction of the braided piezoelectric element 1, and when the metal terminal 20 is grasping the braided piezoelectric element 1 at multiple locations as shown in FIG. 3 (state A), it is the total length of the different grasping portions.

At the location of the grasping portion 21 of the metal terminal 20, or a location within 1 mm from the grasping portion 21, the core 3 of the braided piezoelectric element 1 and the metal terminal 20 are connected directly or indirectly via a conducting material. While not particularly shown in FIG. 3 (state A), it is a feature of the invention that the sheath 2 of the braided piezoelectric element 1 is not loosened at the part where it is fixed with the metal terminal 20, as explained below, and therefore even at the grasping portion 21 of the metal terminal 20, the covering of the sheath 2 is not completely removed, but is partially removed by fusion of the sheath 2, or a conducting material such as a solder or conductive paste is provided, to allow the core of the braided piezoelectric element 1 and the metal terminal 20 to be electrically connected.

It is preferred to provide a connector housing 22 as an exterior package for the metal terminal 20, as shown in FIG. 3 (state A), in a state with the metal terminal 20 that has grasped the braided piezoelectric element 1 being inserted through the opening on the left side of the connector housing 22 and secured, and allowing, another terminal to be connected to the metal terminal 20 inside the connector housing through an opening 23 on the right side of the connector housing 22.

Figure 4:
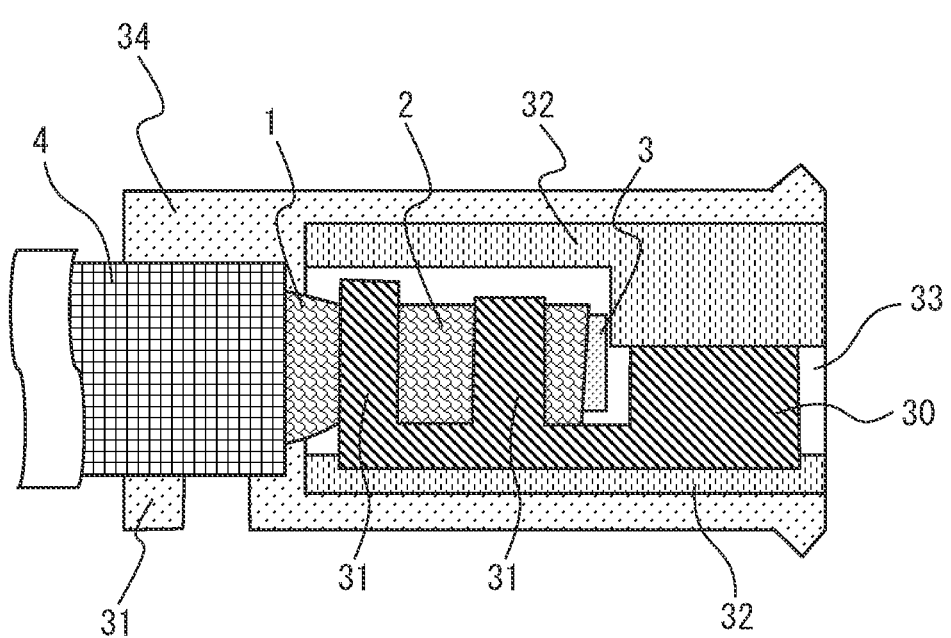
FIG. 4 is a schematic diagram showing an example of connecting a braided piezoelectric element and a metal terminal, according to an embodiment that includes a conductive layer (state A).

FIG. 4 (state A) is a schematic diagram showing an example of the construction of the A state of connection, for an embodiment including a conductive layer 4. The piezoelectric fibers and conductive fiber composing the end of the braided piezoelectric element 1 are grasped by the grasping portion 31, as part of the signal metal terminal 30. A grasped state means that the braided piezoelectric element 1 is sandwiched or wrapped by the grasping portion 31 of the signal metal terminal 30 so that they are mutually fixed. It is preferred to employ a structure in which the signal metal terminal 30 that has been cast into the shape of a hook is in the grasped state described above by plastic deformation using a tool, or a structure in an engaged state by an engagement section provided on the signal metal terminal 30 or insulator. The signal metal terminal 30 has a shape that allows it to be connected to a different terminal on the right side portion in FIG. 4. The signal metal terminal 30 is fixed to the shielding metal terminal 34 via the insulator 32, and the shielding metal terminal 34 is situated so as to cover the signal metal terminal 30. The shielding metal terminal 34 has a grasping portion 31, and is electrically connected and fixed to the conductive layer 4 by grasping of the conductive layer 4 by the grasping portion 31.

In the example shown in FIG. 4, the piezoelectric fibers and conductive fiber composing the end of the braided piezoelectric element are grasped by the grasping portion of the signal metal terminal, but the piezoelectric fibers composing the end of the braided piezoelectric element do not necessarily need to be grasped by the grasping portion of the signal metal terminal.

As suitable connector components that can provide such connection there may be used the coaxial connectors disclosed in Japanese Unexamined Patent Publication HEI No. 4-282580, Japanese Unexamined Patent Publication No. 2002-324636 and Japanese Unexamined Patent Publication No. 2012-79652.

The grasping portion 31 of the signal metal terminal 30 preferably has a length of 0.5 mm or greater, because if it is shorter than this length, fixing between the braided piezoelectric element 1 and the signal metal terminal 30 may be weak, and when different force levels are applied to the element, such as with application in a wearable device, the braided piezoelectric element 1 and signal metal terminal 30 may become separated, or the electrical connection may become unstable. The length of the grasping portion 31 is more preferably 0.7 mm or greater and even more preferably 1.0 mm or greater. The length of the grasping portion 31 is the length along which the signal metal terminal 30 grasps the braided piezoelectric element 1, measured in the lengthwise direction of the braided piezoelectric element 1, and when the signal metal terminal 30 is grasping the braided piezoelectric element 1 at multiple locations as shown in FIG. 4, it is the total length of the different grasping portions.

At the location of the grasping portion 31 of the signal metal terminal 30, or a location within 1 mm from the grasping portion 31, the core 3 and the signal metal terminal 30 of the braided piezoelectric element 1 are connected directly or indirectly via a conducting material. While not particularly shown in FIG. 4, according to the invention the sheath 2 of the braided piezoelectric element 1 is preferably not loosened at the part where it is fixed with the signal metal terminal 30, as explained below, and therefore even at the grasping portion 31 of the signal metal terminal 30, the covering of the sheath 2 is not completely removed, but is partially removed by fusion of the sheath 2, or a conducting material such as a solder or conductive paste is provided, to allow the core 3 of the braided piezoelectric element 1 and the signal metal terminal 30 to be electrically connected. However, even when the sheath 2 is loosened by procedures such as cutting at the end of the braided piezoelectric element 1 or removal of the sheath 2, this does not necessarily apply if the insulator 32 securing the signal metal terminal 30 sufficiently grasps the sheath 2 and the sheath 2 is essentially not loosened, or in other words, if it does not constitute a detrimental noise generation source.

(Connection by State B)

Figure 5:
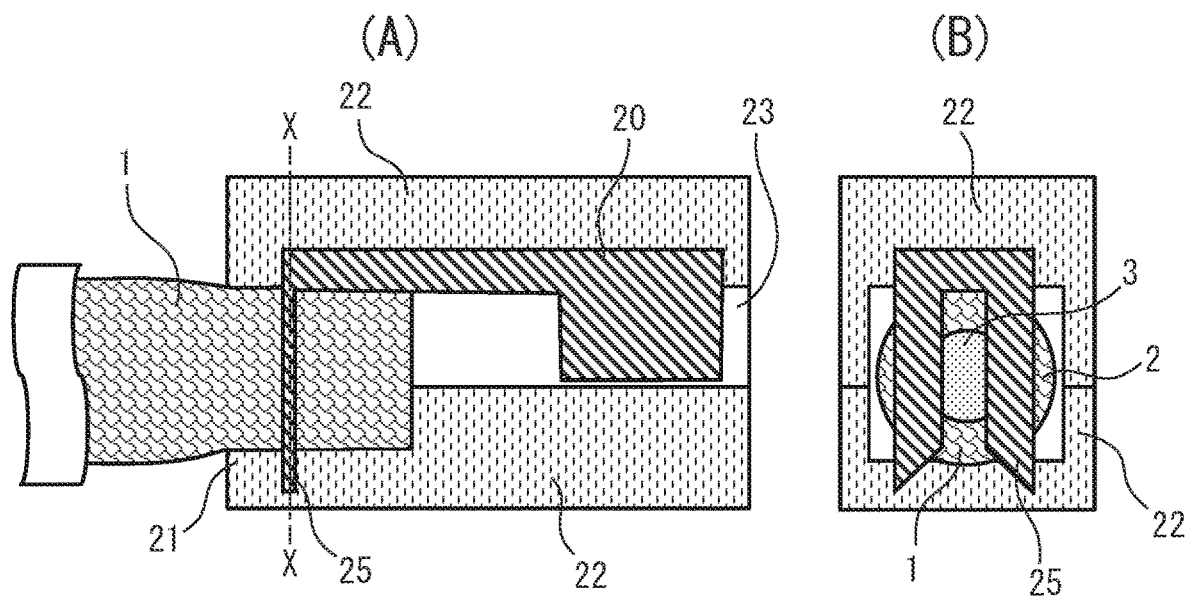
FIG. 5 is a schematic diagram showing an example of connecting a braided piezoelectric element and a metal terminal, according to an embodiment (state B: fork-shaped).
Figure 6:
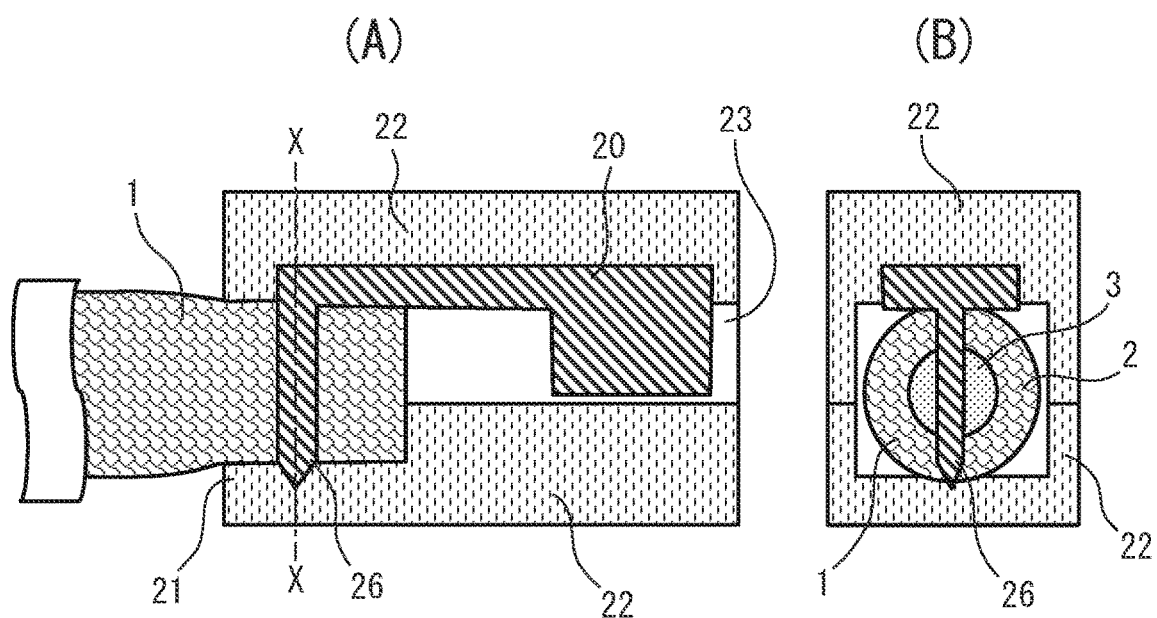
FIG. 6 is a schematic diagram showing an example of connecting a braided piezoelectric element and a metal terminal, according to an embodiment (state B, needle-shaped).

FIG. 5 (state B: fork-shaped) is a schematic diagram showing an example of a construction with a state of connection by a metal terminal 20 comprising a fork-shaped portion 25 in state B according to an embodiment. FIG. 6 (state B: needle-shaped) is a schematic diagram showing an example of a construction with a state of connection by a metal terminal 20 comprising a needle-shaped portion 26 in state B according to an embodiment.

In FIG. 5 (state B: fork-shaped) and FIG. 6 (state B: needle-shaped), the fork-shaped portion 25 or needle-shaped portion 26, which are each part of the metal terminal 20, are connected with the conductive fiber of the core 3 directly or indirectly via, a conducting material, while contacting the sheath 2 of the braided piezoelectric element 1, as shown in each of the cross-sectional views. The metal terminal 20 has a shape that allows it to be connected to a different terminal on the right side in each drawing.

Since the fixing force of the braided piezoelectric element 1 due to the fork-shaped portion 25 or needle-shaped portion 26 of the metal terminal 20 is weak in state B, the braided piezoelectric element 1 is also fixed to the metal terminal 20 by a different section of the metal terminal 20 or by components fixed to the metal terminal 20, and the fixed location must be within 10 mm from the point of the connection of the conductive fiber of the core 3 with the metal terminal 20. If the fixed location is only present at a portion exceeding 10 mm from the point of the connection, the entire braided piezoelectric element 1 that is not fixed, and the sheath 2 loosened by the metal terminal 20, will move in an unstable manner in response to impacts on the sensor, becoming a source of noise. In order to fix the braided piezoelectric element 1 by the other portion of the metal terminal 20 or by the component fixed to the metal terminal 20, the braided piezoelectric element 1 may be grasped at part of the metal terminal 20 as in state A, but more preferably the braided piezoelectric element 1 is grasped by sandwiching by a component such as a resin housing fixed to the metal terminal 20, or it is fixed to the metal terminal 20 or to a component fixed to the metal terminal 20, by an adhesive.

In FIG. 5 (state B: fork-shaped) and FIG. 6 (state B: needle-shaped), a connector housing 22 is provided as an exterior package for the metal terminal 20, and the braided piezoelectric element 1 is grasped by being sandwiched at a portion on the left side of the connector housing 22 in the drawing, as a location fixed by the component fixed to the metal terminal 20. As shown by the cross-sectional views (B) of FIG. 5 (state B: fork-shaped) and FIG. 6 (state B: needle-shaped), the connector housing 22 is divided into two sections, an upper section and a lower section, the upper section of the connector housing being already fixed to the metal terminal 20. When the braided piezoelectric element 1 is connected and fixed to the metal terminal 20, the preferred state is one in which the braided piezoelectric element 1 is sandwiched by the metal terminal 20 fixed to the upper section of the connector housing 22 and the lower section of the connector housing 22, and the metal terminal 20 is inserted into the braided piezoelectric element 1 by further applying up-down force, so that the connector housing 22 at the upper section and lower section becomes fixed in contact with it. Consequently, the fork-shaped portion 25 and needle-shaped portion 26 of the metal terminal 20 are preferably either formed with the narrowness or thinness necessary to be inserted between the fibers of the piezoelectric fibers of the sheath 2, or they are formed with the sharpness necessary to partially cut the piezoelectric fibers of the sheath 2. One metal terminal 20 may have multiple fork-shaped portions 25 or multiple needle-shaped portions 26, or it may even have both a fork-shaped portion 25 and a needle-shaped portion 26. When a metal terminal 20 having a fork-shaped portion 25 is used, the fork-shaped portion is less likely to contact with the core 3 if the thickness of the sheath 2 is too large or the total fineness of the core is too low, and therefore the thickness of the sheath 2 is preferably no greater than 1 mm and more preferably no greater than 0.5 mm, and the total fineness of the core 3 is preferably 50 dTex or greater and more preferably 100 dTex or greater.

In FIG. 5 (state B: fork-shaped) and FIG. 6 (state B: needle-shaped), the state is such that a different terminal can be connected to the metal terminal 20 inside the connector housing 22 through an opening 23 on the right side of the connector housing 22.

Figure 7:
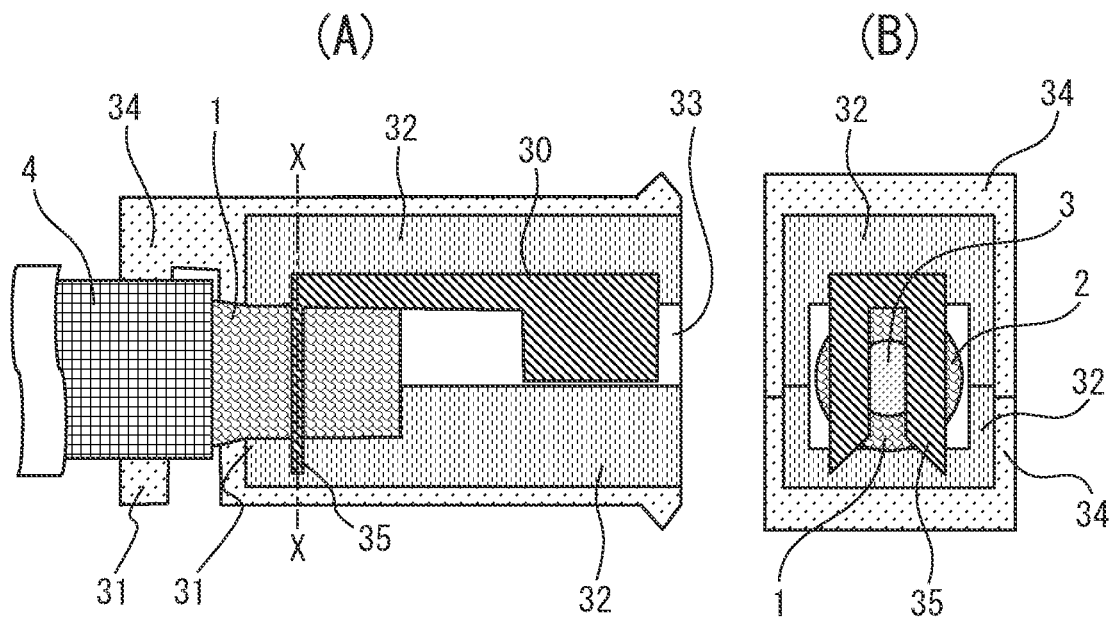
FIG. 7 is a schematic diagram showing an example of connecting a braided piezoelectric element and a metal terminal, according to an embodiment that includes a conductive layer (state B: fork-shaped).
Figure 8:
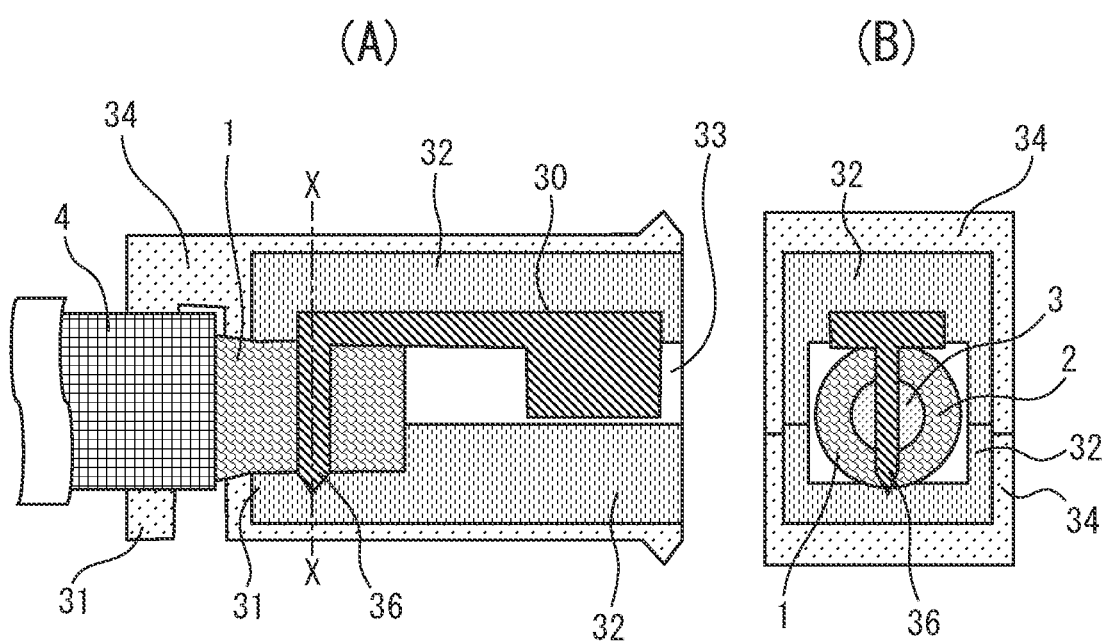
FIG. 8 is a schematic diagram showing an example of connecting a braided piezoelectric element and a metal terminal, according to an embodiment that includes a conductive layer (state B, needle-shaped).

FIG. 7 (state B: fork-shaped) is a schematic diagram showing an example of a construction with a state of connection by a signal metal terminal 30 comprising a fork-shaped portion 35 in state B according to an embodiment that includes a conductive layer 4. FIG. 8 (state B: needle-shaped) is a schematic diagram showing an example of a construction with a state of connection by a signal metal terminal 30 comprising a needle-shaped portion 36 in state B according to an embodiment that includes a conductive layer 4.

In FIG. 7 and FIG. 8, the fork-shaped portion 35 or needle-shaped portion 36, which are each part of the signal metal terminal 30, are connected with the conductive fiber of the core 3 directly or indirectly via, a conducting material, while contacting the sheath 2 of the braided piezoelectric element 1, as shown in each of the cross-sectional views. The signal metal terminal 30 has a shape that allows it to be connected to a different terminal on the right side portion in each drawing. The signal metal terminal 30 is fixed to the shielding metal terminal 34 via the insulator 32, and the shielding metal terminal 34 is situated so as to cover the signal metal terminal 30. The shielding metal terminal 34 has a grasping portion 31, and is electrically connected and fixed to the conductive layer 4 by grasping of the conductive layer 4 by the grasping portion 31.

The connector component in which such connection is made may be the stacked cable connector disclosed in Japanese Unexamined Patent Publication No. 2006-277960.

For state B, when the fixing force of the braided piezoelectric element 1 by the fork-shaped portion 35 or needle-shaped portion 36 of the signal metal terminal 30 alone is insufficient, the braided piezoelectric element 1 is preferably also fixed to the signal metal terminal 30 by another portion of the signal metal terminal 30 or a component fixed to the signal metal terminal 30. Such an additional fixed location is preferably at a location within 10 mm from the point of the connection of the conductive fiber of the core 3 with the signal metal terminal 30. If the additional fixed location is only present at a portion exceeding 10 mm from the point of the connection, then the entire braided piezoelectric element 1 that is not fixed, and the sheath 2 loosened by the signal metal terminal 30, will move in an unstable manner in response to impacts on the sensor, potentially becoming a source of noise. In order to fix the braided piezoelectric element 1 by the other portion of the signal metal terminal 30 or by the component fixed to the signal metal terminal 30, the braided piezoelectric element 1 may be grasped at part of the signal metal terminal 30 as in state A, but more preferably the braided piezoelectric element 1 is grasped by sandwiching by a component such as a resin housing fixed to the signal metal terminal 30, or it is fixed to the signal metal terminal 30 or to a component fixed to the signal metal terminal 30, by an adhesive.

In FIG. 7 and FIG. 8, as an example of an additional fixed location, there is provided an insulator 32 as an exterior package for the signal metal terminal 30, and the braided piezoelectric element 1 is grasped by sandwiching at the portion on the left side of the insulator 32 in the drawing, as a fixed location by the component fixed to the signal metal terminal 30. The insulator 32 is divided into 2 sections, an upper section and a lower section, and the upper section of the insulator 32 may be already fixed to the signal metal terminal 30, as shown in the cross-sectional views (B) of FIG. 7 and FIG. 8. When the braided piezoelectric element 1 is connected and fixed to the signal metal terminal 30, the preferred state is one in which the braided piezoelectric element 1 is sandwiched by the signal metal terminal 30 fixed to the upper section of the insulator 32 and the lower section of the insulator 32, and the signal metal terminal 30 is inserted into the braided piezoelectric element 1 by further applying up-down force, so that the insulator 32 at the upper section and lower section becomes fixed in contact with it. Consequently, the fork-shaped portion 35 and needle-shaped portion 36 of the signal metal terminal 30 are preferably either formed with the narrowness or thinness necessary to be inserted between the fibers of the piezoelectric fibers of the sheath 2, or they are formed with the sharpness necessary to partially cut the piezoelectric fibers of the sheath 2. One signal metal terminal 30 may have multiple fork-shaped portions 35 or multiple needle-shaped portions 36, or it may have both a fork-shaped portion 35 and a needle-shaped portion 36. When a signal metal terminal 30 having a fork-shaped portion 35 is used, the fork-shaped portion 35 is less likely to contact with the core 3 if the thickness of the sheath 2 is too large or the total fineness of the core 3 is too low, and therefore the thickness of the sheath 2 is preferably no greater than 1 mm and more preferably no greater than 0.5 mm, and the total fineness of the core 3 is preferably 50 dTex or greater and more preferably 100 dTex or greater.

(Terminal Connector)

The edge of the portion of the braided piezoelectric element of the invention that is secured by the signal metal terminal or a component fixed to the metal terminal has a portion where the piezoelectric fibers resulting from loosening of the sheath structure and separation from the core are less than 20% of the total piezoelectric fibers of the sheath. If this exceeds 20%, then piezoelectric fibers that have separated from the core will move in an unstable manner by impact on the sensor, thereby generating random piezoelectric signals and creating noise. The portion where the braided piezoelectric element is fixed by the metal terminal or the component fixed to the metal terminal is, in state A, the portion grasped by the metal terminal, or in state B, the portion where the fork-shaped portion or needle-shaped portion of the metal terminal is in contact with the sheath of the braided piezoelectric element, or in state A and state B, the portion where the braided piezoelectric element is grasped by being sandwiched by a component such as a resin housing that is secured to the metal terminal, or the portion where the braided piezoelectric element is fixed to the metal terminal or a component fixed to the metal terminal, by an adhesive. The edge is the region within 1 mm from the border section between the fixed portion and the non-fixed portion. Loosening of the sheath structure and separation from the core means a state in which the piezoelectric fibers of the sheath reach to a location at a distance of at least 1.5 times the mean thickness of the sheath of the braided piezoelectric element from the surface of the core, and it is assessed for each piezoelectric fiber (that is, a fiber supplied from one carrier during formation of the braid). When the piezoelectric fibers of the sheath are multifilaments, and at least 50% of the filaments composing a single piezoelectric fiber reach to a distance of at least 1.5 times the mean thickness of the sheath of the braided piezoelectric element from the surface of the core, the single piezoelectric fiber is assessed as being separated from the core through loosening of the sheath structure. The assessment may be made by observation from the side of the braided piezoelectric element or by observation of a cross-section. For observation of a cross-section, it is cut and observed after anchoring with an epoxy resin or the like, so that the sheath is not excessively loosened when cut.

The signal metal terminal of the element of the invention may be fixed to the end of the braided piezoelectric element 1, as shown in FIG. 3 and FIG. 4 (state A) and FIG. 5 and FIG. 7 (state B: fork-shaped), as well as FIG. 6 and FIG. 8 (state B: needle-shaped), or it may be fixed to a middle location of the braided piezoelectric element 1.

In order to achieve the object of minimizing piezoelectric-induced noise, the element of the invention has a seemingly contradictory structure, in which the signal metal terminal is fixed while leaving unremoved the fibers of the braided sheath which are an insulating cover, ensuring electrical connection between the core and signal metal terminal. The following are two examples of structures whereby this is achieved.

As one example of the structure, there is preferably employed a structure wherein all or some of the piezoelectric fibers of the sheath within 5 mm from the connected portion between the core and the signal metal terminal have lost their fiber shapes and are fused. Specifically, by fusing the piezoelectric fibers composing the sheath after fixing of the metal terminal, the piezoelectric fibers of the sheath that block electrical connection between the metal terminal and the core become fluidized, ensuring electrical connection between the metal terminal and the core, after which they may be cooled, resolidifying and fixing the piezoelectric fibers. The solid formed by fusing and then solidification of the piezoelectric fibers has the advantage of being able to fix the braided piezoelectric element and metal terminal, in the manner of an adhesive. Moreover, when polymer fibers such as polylactic acid are used as the piezoelectric fibers, the solid obtained by fusing and then solidification loses its piezoelectricity, and therefore does not become a potential noise source. Fusion of the solidified piezoelectric fibers can be carried out by heat treatment at a temperature of 160° C. or higher, when polylactic acid fibers are used, but it is preferably carried out at no higher than 220° C. in order to prevent unwanted decomposition of polylactic acid and unwanted fusion of the sheath or deformation of the other members. Fusion of the piezoelectric fibers may also be carried out during fixing of the metal terminal, but preferably the grasping pressure of the metal terminal is strengthened while confirming that electrical connection is ensured, and in order to prevent unwanted deformation of the sheath, preferably the metal terminal is heated to transfer heat to the sheath and cause fusion. From the viewpoint of process safety and allowing simultaneous processing of multiple elements, it is preferably carried out after mounting the metal terminal.

As a different example of the structure, there may be used a structure in which the surface of the sheath is provided with a conducting material, which comprises a solder or conductive paste and is electrically connected to the core, the core and the metal terminal being indirectly connected by contact between the conducting material and the signal metal terminal provided on the surface of the sheath. The conducting material has the function of causing electrical conduction between the core and the metal terminal, and any one may be used that is converted from a liquid form (including a slurry form) to a solid form by temperature change, solvent removal or chemical reaction, and it is preferred to use a conductive paste containing a conductive filler, such as solder, metal or carbon. Solder and silver paste are most preferably used for handleability and conductivity. In the braided piezoelectric element of the invention, due to aggregation of the fibers, the insulating coating infiltrates from the surface to the interior when the conducting material is adhered, making it possible to form a conducting surface that is electrically connected with the core on the surface of the sheath, but in order to create more reliable electrical connection with the core, it is preferred to either lower the flow property of the conducting material before solidification to aid in infiltration to the core, or to apply physical stimulation of the braided piezoelectric element before solidification of the conducting material in order to widen the gaps between the fibers of the sheath, or to also adhere the conducting material onto the cut surface at the end of the braided piezoelectric element.

(Fixing onto Base Material)

In the braided piezoelectric element of the invention, preferably at least part of the braided piezoelectric element is fixed to a fabric-like base material within a length of 10 mm from the portion where the signal metal terminal or shielding metal terminal is fixed to the braided piezoelectric element. If there is no location fixed to the fabric-like base material within 10 mm, the non-fixed braided piezoelectric element will move in an unstable manner due to impacts on the fabric-like base material and metal terminal, constituting a cause of noise. Fixing onto the fabric-like base material may be carried out by post-processing such as adhesion or sewing, or fixing may be by weaving or knitting as a yarn forming a fabric texture.

(Production Method)

The braided piezoelectric element 1 of the invention has the surface of at least one conductive fiber B covered by the braided piezoelectric fibers A, and the method for its production may be the following, for example. That is, it may be a method of preparing the conductive fiber B and the piezoelectric fibers A in separate steps, and coiling the piezoelectric fibers A in braided form around the conductive fiber B to cover it. In this case, the covering is preferably carried out as nearly concentrically as possible.

In this case, the preferred spinning and stretching conditions, when using polylactic acid as the piezoelectric polymer forming the piezoelectric fibers A, is a melt spinning temperature of preferably 150° C. to 250° C., a stretching temperature of preferably 40° C. to 150° C., a draw ratio of preferably 1.1 to 5.0 and a crystallization temperature of preferably 80° C. to 170° C.

The piezoelectric fibers A coiled around the conductive fiber B may be a multifilament comprising a bundle of a plurality of filaments, or a monofilament, or they may be a single spun yarn, or a fiber bundle comprising a plurality of spun yarns that have been bundled (including twisted yarn), or a long/short composite yarn comprising a blend of filament and spun yarn. The conductive fiber B around which the piezoelectric fibers A are to be coiled may also be a multifilament consisting of bundles of multiple filaments, or a monofilament. It may also be a single spun yarn, or a fiber bundle comprising a plurality of spun yarns that have been bundled (including twisted yarn), or a long/short composite yarn comprising a blend of filament and spun yarn.

The preferred manner of covering is to use the conductive fiber B as the core thread and braid the piezoelectric fibers A around its periphery in a braided form to prepare a tubular braid to cover it. More specifically, this may be an 8-strand braid or 16-strand braid with the core 3. However, the piezoelectric fibers A may be in the form of a braided tube, for example, with the conductive fiber B as the core inserted in the braided tube to cover it.

The conductive layer 4 is produced by coating or fiber coiling, but fiber coiling is preferred from the viewpoint of facilitating production. The method of fiber coiling may be a cover ring, knitted fabric or braid, and the production may employ any method.

By the production method described above it is possible to obtain a braided piezoelectric element 1 having the surface of the conductive fiber B covered with the braided piezoelectric fibers A, and further having the conductive layer 4 around its periphery, if necessary.

The braided piezoelectric element 1 of the invention does not require formation of an electrical signal-detecting electrode on the surface, and it can therefore be produced in a relatively simple manner.

(Protective Layer)

A protective layer may also be provided on the outer surface of the braided piezoelectric element 1 of the invention. The protective layer preferably has an insulating property, and from the viewpoint of flexibility it is more preferably composed of a polymer. When the protective layer is given an insulating property, naturally the protective layer will also be deformed and the protective layer will be rubbed, but there are no particular restrictions so long as the external force reaches the piezoelectric fibers A and can induce polarization. The protective layer is not limited to being formed by coating of the polymer or the like, and it may instead be a coiled film, fabric, fiber or the like, or a combination of these.

The thickness of the protective layer is as small as possible to facilitate transmission of shearing stress to the piezoelectric fibers A, but if it is too small, problems may be caused such as breakdown of the protective layer itself, and it is therefore preferably 10 nm to 200 μm, more preferably 50 nm to 50 μm, even more preferably 70 nm to 30 μm and most preferably 100 nm to 10 μm. The shape of the piezoelectric element may also be created by the protective layer.

In addition, an electromagnetic shield layer may be incorporated into the braid structure in order to reduce noise. The electromagnetic shield layer is not particularly restricted, but a conductive substance may be coaled, or a conductive film, fabric, fiber or the like may be coiled. The volume resistivity of the electromagnetic shield layer is preferably no greater than $10^{-1}$ Ω·cm, more preferably no greater than $10^{-2}$ Ω·cm and even more preferably no greater than $10^{-3}$ Ω·cm. However, the resistivity is not limited to this range so long as the effect of the electromagnetic shield layer can be obtained.

The electromagnetic shield layer may be provided on the surface of the piezoelectric fibers A of the sheath, or it may be provided on the outer side of the aforementioned protective layer. Naturally, multiple layers of the electromagnetic shield layer and protective layer may be overlaid, the order being suitably determined according to the purpose.

In addition, a plurality of layers made of piezoelectric fibers may be provided, or a plurality of layers made of conductive fibers for signal extraction may be provided. Naturally, the number and order of the protective layer, the electromagnetic shield layer, the layer made of piezoelectric fibers and the layer made of conductive fibers, may be determined as appropriate according to the purpose. The coiling method may be a method of additionally forming a braid structure over the outer layer of the sheath 2, or a method of forming a cover ring.

(Function)

The braided piezoelectric element 1 of the invention can be utilized as a sensor that detects the size and/or location of application of stress produced when a load is applied to the braided piezoelectric element 1 by, for example, rubbing of the surface of the braided piezoelectric element 1, or in other words stress applied to the braided piezoelectric element 1. In addition, the braided piezoelectric element 1 of the invention can, of course, extract an electrical signal even if shearing stress is applied to the piezoelectric fibers A by pressing force or bending deformation instead of rubbing. For example, the "applied stress" on the braided piezoelectric element 1 may be frictional force between the surface of the piezoelectric element, i.e. the surfaces of the piezoelectric fibers A, and the surface of the contacting object, such as a finger, or it may be resistance in the direction perpendicular to the surface or tip section of the piezoelectric fibers A, or resistance against bending deformation of the piezoelectric fibers A. The braided piezoelectric element 1 of the invention can efficiently output a particularly large electrical signal when bending or rubbing has occurred in the direction parallel to the conductive fiber B.

The "applied stress" on the braided piezoelectric element 1 is approximately 1 to 1000 Pa, as a rule, for the level of stress of rubbing of a surface with a finger, for example. Needless to mention, it is possible to detect even a greater degree of applied stress at the applied location. When input is made with a finger or the like, preferably operation can be performed with a load of between 1 Pa to 500 Pa, inclusive, and more preferably operation can be performed with a load of between 1 Pa and 100 Pa, inclusive. Naturally, operation can be performed even with a load exceeding 500 Pa, as mentioned above.

It is also possible to detect deformation caused by pressure applied to the braided piezoelectric element 1 by calculating the change in electrostatic capacitance between the conductive fiber B of the core of the braided piezoelectric element 1, and the conductive layer 4. When multiple braided piezoelectric elements 1 are used in combination, the change in electrostatic capacitance between the conductive layers 4 of each of the braided piezoelectric elements 1 may be calculated to detect deformation caused by pressure applied to the braided piezoelectric element 1.

(Fabric-Like Piezoelectric Element)

Figure 9:
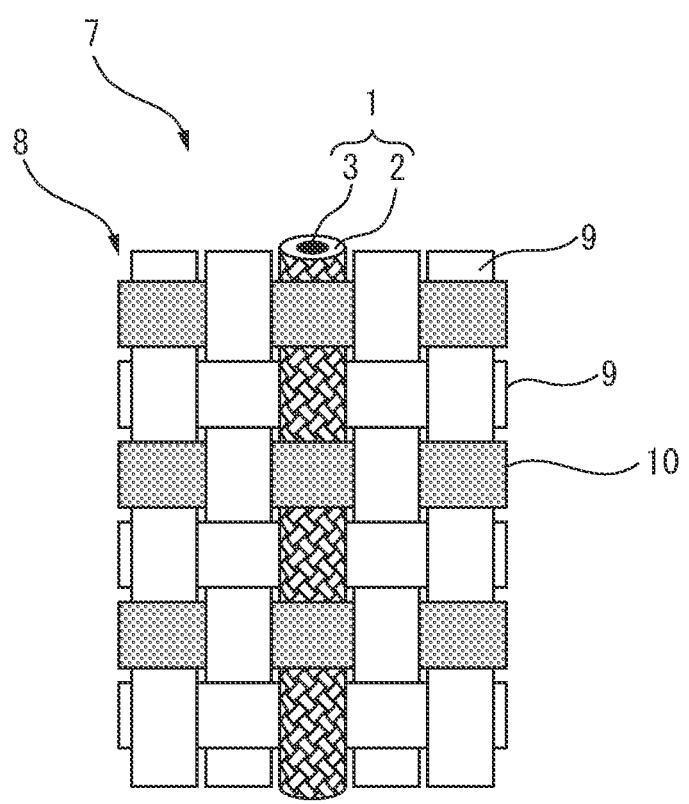
FIG. 9 is a schematic diagram showing an example of the construction of a fabric-like piezoelectric element according to an embodiment.
Figure 10:
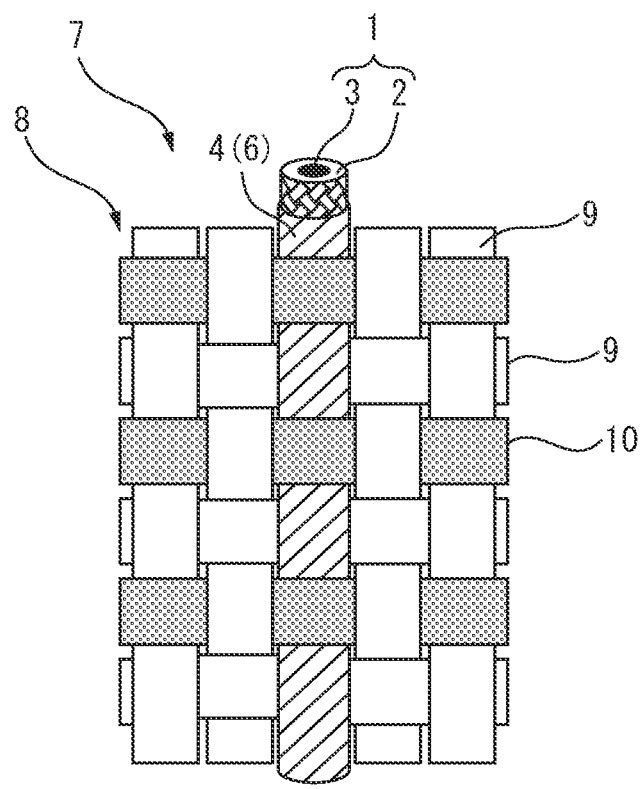
FIG. 10 is a schematic diagram showing an example of the construction of a fabric-like piezoelectric element according to an embodiment that includes a conductive layer.

FIG. 9 and FIG. 10 are schematic diagrams showing an example of the construction of a fabric-like piezoelectric element using a braided piezoelectric element according to an embodiment.

The fabric-like piezoelectric element 7 comprises a fabric 8 including at least one braided piezoelectric element 1. The fabric 8 may be any type of woven or knitted fabric wherein at least one of the fibers (including braids) composing the fabric is a braided piezoelectric element 1, with no particular limitation so long as the braided piezoelectric element 1 can exhibit the function of a piezoelectric element. For a fabric, union weaving, mixed knitting or the like may be carried out with other fibers (including braids), so long as the object of the invention is achieved. Naturally, the braided piezoelectric element 1 may be used as a portion of fibers composing a fabric (for example, warp thread or weft thread), or the braided piezoelectric element 1 may be embroidered or bonded with a fabric. In the examples shown in FIG. 9 and FIG. 10, the fabric-like piezoelectric element 7 is a plain weave fabric having at least one braided piezoelectric element 1 and insulating fibers 9 arranged as warp thread and the conductive fibers 10 and insulating fibers 9 alternately arranged as weft thread. The conductive fibers 10 may be of the same type as the conductive fiber B or a different type of conductive fiber, and the insulating fibers 9 will be described below. All or some of the insulating fibers 9 and/or conductive fibers 10 may also be in braided form.

In this case, when the fabric-like piezoelectric element 7 has deformed by bending or the like, the braided piezoelectric element 1 also deforms in a manner following that deformation, and the deformation of the fabric-like piezoelectric element 7 can be detected by the electrical signal outputted from the braided piezoelectric element 1. Furthermore, since the fabric-like piezoelectric element 7 can be used as a fabric (woven or knitted fabric), it can be applied as a wearable sensor in the form of clothing, for example.

In addition, in the fabric-like piezoelectric element 7 shown in FIG. 9 and FIG. 10, the conductive fibers 10 are in crossing contact with the braided piezoelectric element 1. Therefore, the conductive fibers 10 are in crossing contact with at least portions of the braided piezoelectric element 1, covering it, thereby blocking at least some of the electromagnetic waves directed toward the braided piezoelectric element 1 from the exterior. The conductive fibers 10 are grounded (earthed) so as to have a function of reducing the effects of electromagnetic waves on the braided piezoelectric element 1. That is, the conductive fibers 10 can function as an electromagnetic shield for the braided piezoelectric element 1. Thus, it is possible to significantly increase the S/N ratio of the fabric-like piezoelectric element 7 even without layering a conductive fabric as an electromagnetic shield above and below the fabric-like piezoelectric element 7, for example. In this case, from the viewpoint of electromagnetic shielding, a higher proportion is preferred for the conductive fibers 10 in the weft thread (in the case of FIG. 9 and FIG. 10) crossing with the braided piezoelectric element 1. Specifically, at least 30%, more preferably at least 40% and even more preferably at least 50% of the fibers forming the fabric 8 and crossing with the braided piezoelectric element 1, are conductive fibers 10. In this type of fabric-like piezoelectric element 7, conductive fibers 10 may be inserted for at least some of the fibers composing the fabric, to allow an electromagnetic wave shield-bearing fabric-like piezoelectric element 7 to be obtained.

Examples for the woven texture of the woven fabric include the three foundational types of weaves: plain weave, twill weave and satin weave, half-double weaves such as derivative weave, warp backed weave and weft backed weave, and warp velvet weaves. The type of knitted fabric may be a circular knit fabric (weft knitted fabric) or a warp knitted fabric. Examples of preferred textures of circular knit fabrics (weft knitted fabrics) include plain stitch, rib stitch, interlock stitch, purl stitch, tuck stitch, float stitch, rib-and-tuck stitch, lace stitch and plating stitch. Examples of warp braid stitches include single denbigh stitch, single atlas stitch, double cord stitch, half-tricot stitch, lined stitch and jacquard stitch. It may consist of a single layer, or a multilayer with two or more layers. Alternatively, it may be a plush weave or plush stitch, composed of nap sections and ground weave sections comprising cut piles and/or loop piles.

(Multiple Piezoelectric Elements)

Multiple braided piezoelectric elements 1 may also be used in an arrangement in the fabric-like piezoelectric element 7. The manner of arrangement may be, for example, using the braided piezoelectric element 1 for all of the warp thread or weft thread, or the braided piezoelectric elements 1 may be used for several groups or sections thereof. Also, braided piezoelectric elements 1 may be used as warp threads at certain sections and braided piezoelectric elements 1 used as weft threads at other sections.

When a plurality of braided piezoelectric elements 1 are arranged to form the fabric-like piezoelectric element 7, an advantage is afforded whereby the manner of arrangement and manner of knitting may be selected within a wide range, since the braided piezoelectric elements 1 lack electrodes on the surface.

When a plurality of braided piezoelectric elements 1 are arranged, electrical signals can be efficiently extracted because the distance between conductive fibers B is short. According to the invention, most preferably all of the multiple metal terminals connected to each braided piezoelectric element are fixed to a connector housing having a single opening, in order to form a connector having multiple poles, allowing it to be connected together to another connector with multiple poles, thereby producing a more efficient device structure and to help facilitate connection and removal by the user. By incorporation into the texture of a woven fabric or knitted fabric, as mentioned above, it is possible to easily arrange a plurality of braided piezoelectric elements at a desired spacing, as an advantage to facilitate fixing of each metal terminal to a connector. Preferably, the woven density or knitted density are adjusted to adjust the spacings between the multiple braided piezoelectric elements to connector terminal spacings that are often used for electronic circuits, and more preferably they are adjusted to spacings of 0.5 mm, 1.0 mm, 1.25 mm, 1.5 mm, 2.0 mm and 2.54 mm (distances between the centers of the braids). From the viewpoint of simplification of the process, it is most preferred to have the fork-shaped location of state B, and to use a connector in which a plurality of metal terminals are already fixed to a single connector housing, for connection of a plurality of metal terminals as a unit to a plurality of braided piezoelectric elements.

(Insulating Fiber)

In the fabric-like piezoelectric element 7, insulating fibers may also be used at sections other than the braided piezoelectric element 1 (and conductive fibers 10). In this case, the insulating fibers used may be fibers of a material and shape that are stretchable, in order to improve the flexibility of the fabric-like piezoelectric element 7.

By situating insulating fibers in this manner at sections other than the braided piezoelectric element 1 (and conductive fibers 10), it is possible to increase the operativity of the fabric-like piezoelectric element 5 (for example, the ease of movement for a wearable sensor).

Such insulating fibers that are used need only have a volume resistivity of $10^6$ $\Omega \cdot cm$ or greater, more preferably $10^8$ $\Omega \cdot cm$ or greater and even more preferably $10^{10}$ $\Omega \cdot cm$ or greater.

Examples of insulating fibers to be used include synthetic fibers such as polyester fiber, nylon fiber, acrylic fiber, polyethylene fiber, polypropylene fiber, vinyl chloride fiber, aramid fiber, polysulfone fiber, polyether fiber and polyurethane fiber, as well as natural fibers such as cotton, hemp and silk, semisynthetic fibers such as acetate, and regenerated fibers such as rayon and copra. There is no restriction to these, however, and any publicly known insulating fibers may be used as desired. These insulating fibers may also be used in combination, or combined with fibers having no insulating property to form fibers with an overall insulating property.

Fibers with various publicly known cross-sectional shapes may also be used.

(Technology for Use of Piezoelectric Element)

The piezoelectric element of the invention in any desired form, such as the braided piezoelectric element 1 or fabric-like piezoelectric element 5, can output contact, pressure and shape deformation on the surface as an electrical signal, and therefore it can be utilized as a sensor (device) that detects the size of stress and/or the location of stress applied to the piezoelectric element. In addition, the electrical signal can be used as a power generating element, to serve as an electric power source to drive another device, or for storage. Specifically, this may include electric power generation by use at movable pans that autonomously move, such as those of a human, animal, robot or machine, electric power generation on the surface of a structure subjected to pressure from a shoe sole, mat or exterior, and electric power generation by shape deformation in a fluid. For generation of an electrical signal by shape deformation in a fluid, an electrostatic substance in a fluid may be adsorbed, or its adhesion inhibited.

Figure 11:
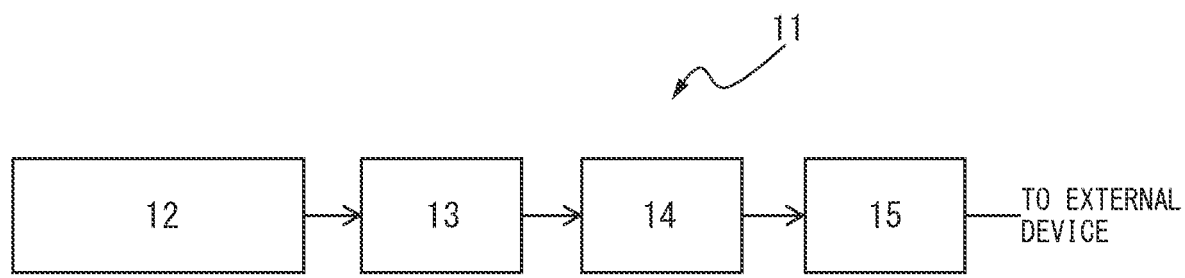
FIG. 11 is a block diagram showing a device comprising a piezoelectric element according to an embodiment.

FIG. 11 is a block diagram showing a device 11 comprising a piezoelectric element 12 of the invention. The device 11 comprises a piezoelectric element 12 (e.g. a braided piezoelectric element 1 or fabric-like piezoelectric element 7), amplification means 13 that amplifies an electrical signal outputted from the piezoelectric element 12 in response to applied pressure, output means 14 that outputs the electrical signal amplified at the amplification means 13, and transmission means 15 that transmits the electrical signal outputted from the output means 14 to an external device (not shown). By using the device 11, it is possible to detect the size and/or applied location of stress applied to a piezoelectric element, by computation processing at an external device (not shown), based on an electrical signal outputted by contact, pressure or shape deformation on the surface of a piezoelectric element 12. Alternatively, computing means (not shown) may be provided in the device 11, that computes the size and/or applied location of stress applied to the piezoelectric element 12, based on the electrical signal outputted from the output means 14. Incidentally, the transmission system using transmission means 15 may be either wireless or wired, determined as appropriate depending on the sensor to be constructed.

Instead of the amplification means alone, it may also be used in combination with publicly known signal processing means, such as noise-canceling means or means for combined processing with other signals. The order of connection of such means may be modified as appropriate depending on the purpose. Naturally, the electrical signal outputted from the piezoelectric element 12 may be subjected to signal processing after being directly transmitted to an external device.

Figure 12:
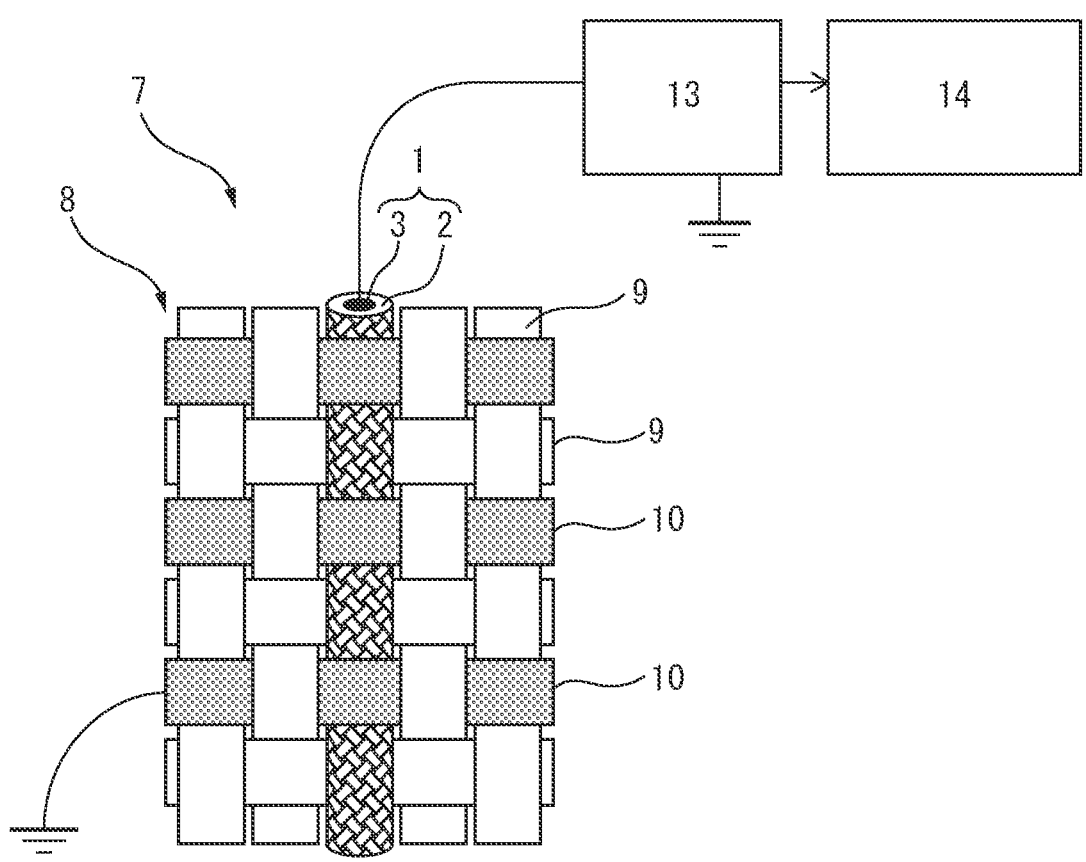
FIG. 12 is a schematic diagram showing an example of the construction of a device comprising a fabric-like piezoelectric element according to an embodiment.
Figure 13:
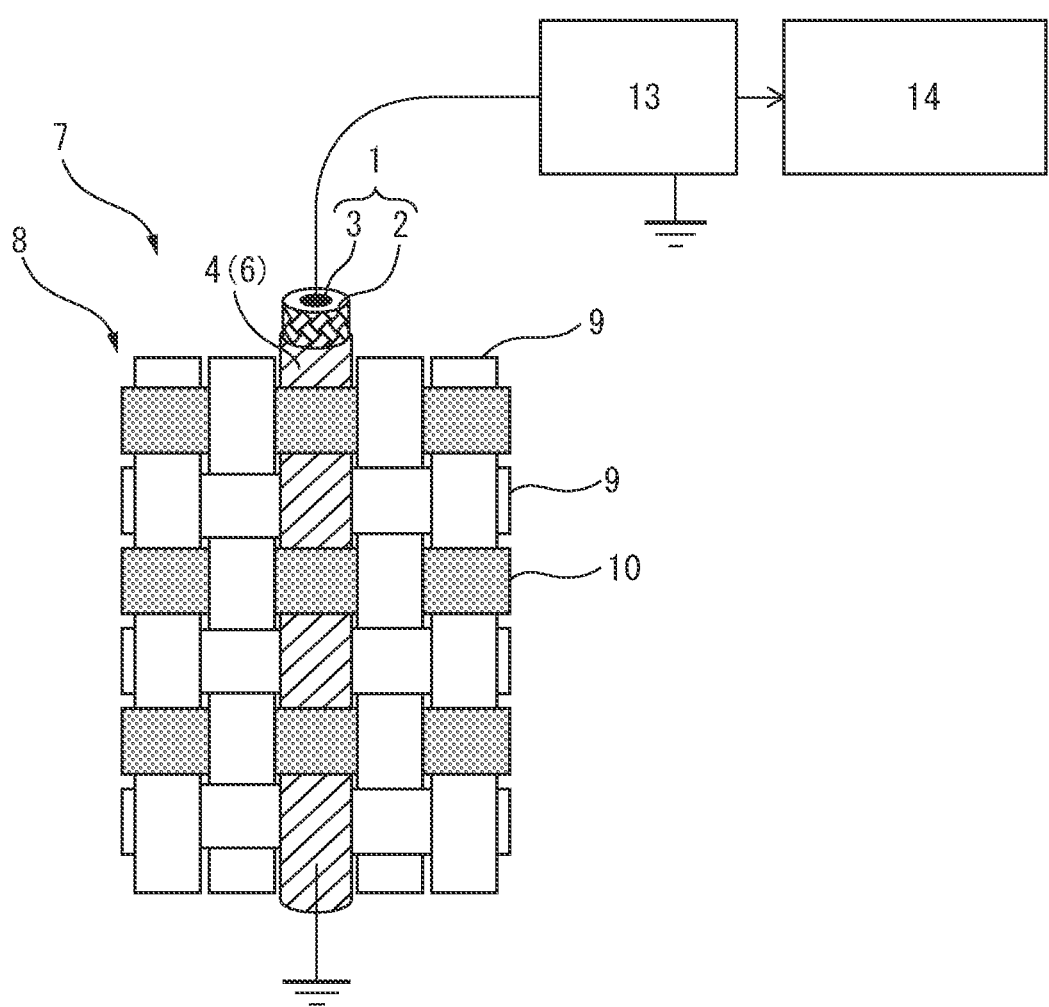
FIG. 13 is a schematic diagram showing an example of the construction of a device comprising a fabric-like piezoelectric element according to an embodiment.
Figure 14:
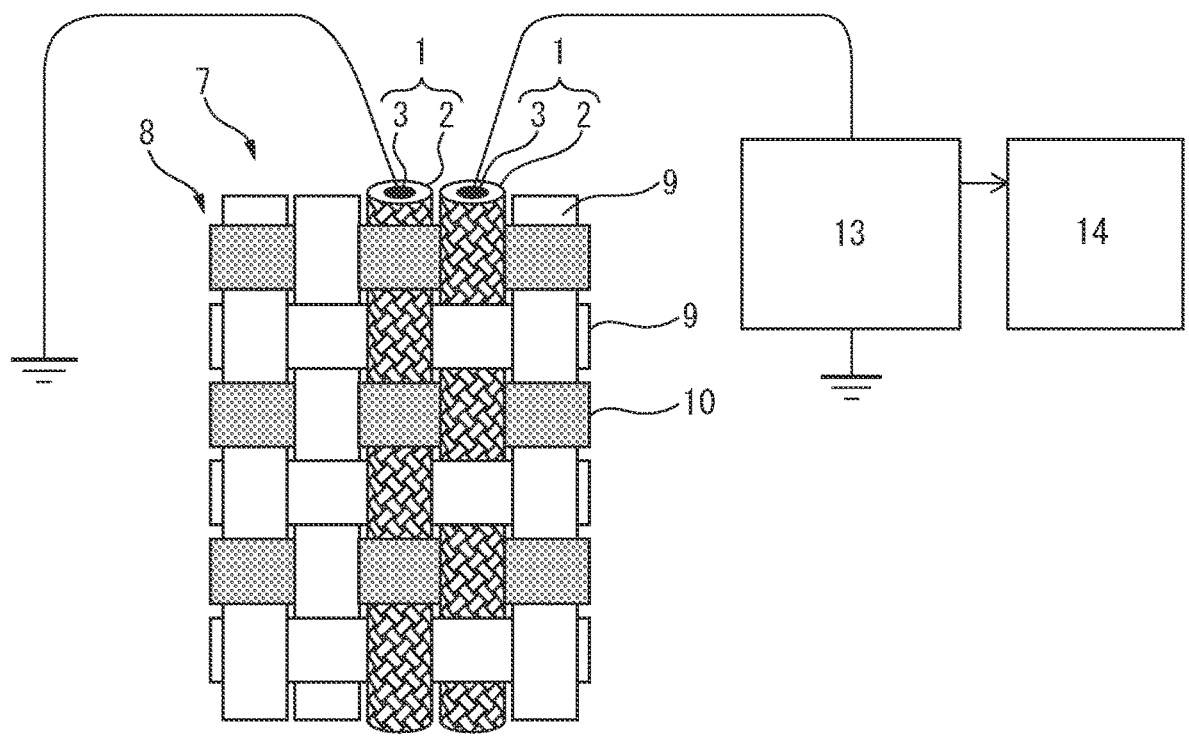
FIG. 14 is a schematic diagram showing another example of the construction of a device comprising a fabric-like piezoelectric element according to an embodiment.
Figure 15:
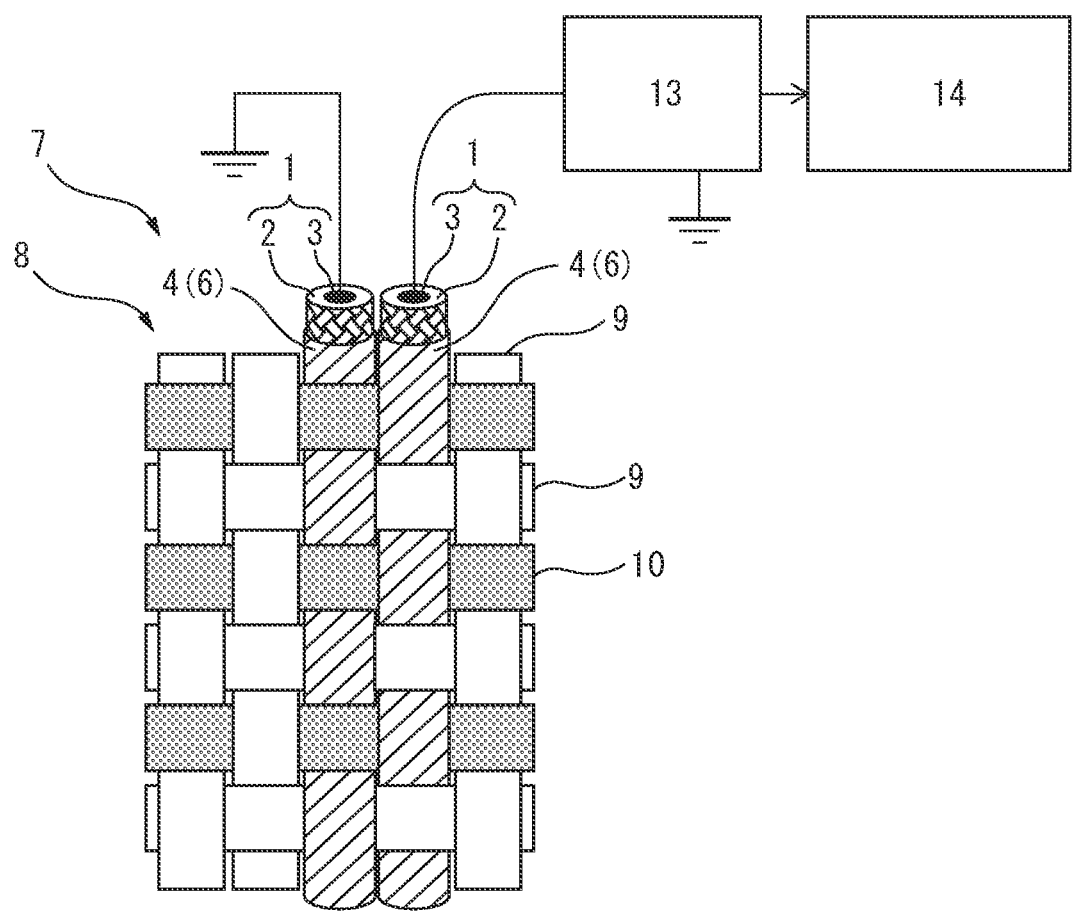
FIG. 15 is a schematic diagram showing another example of the construction of a device comprising a fabric-like piezoelectric element according to an embodiment.

FIGS. 12 to 15 are schematic diagrams showing examples of the construction of a device comprising a fabric-like piezoelectric element according to an embodiment. The amplification means 13 in each of FIGS. 12 to 15 corresponds to the one explained with reference to FIG. 11, although the illustrations in FIGS. 12 to 15 omit the output means 14 and transmission means 15 shown in FIG. 11. When a device is constructed comprising a fabric-like piezoelectric element 7, a lead wire is connected from the core 3 of the braided piezoelectric element 1 to an input terminal of the amplification means 13, while a braided piezoelectric element separate from the braided piezoelectric element 1 that is connected to the input terminal of the amplification means 13, or a conductive fiber 10, is connected to a ground (earth) terminal. For example, as shown in FIG. 12, in the fabric-like piezoelectric element 7 a lead wire from the core 3 of the braided piezoelectric element 1 is connected to the input terminal of the amplification means 13, and the conductive fibers 10 contacting with the braided piezoelectric element 1 in a crossing manner are grounded (earthed). Alternatively, when multiple braided piezoelectric elements 1 are arranged in the fabric-like piezoelectric element 5 as shown in FIG. 14, for example, one lead wire from the core 3 of one braided piezoelectric element 1 is connected to the input terminal of the amplification means 13, while a lead wire from the core 3 of another braided piezoelectric element 1 alongside the braided piezoelectric element 1 is grounded (earthed). As a different mode, when a device is constructed comprising a fabric-like piezoelectric element 7 including a conductive layer 4, a lead wire is connected from the core 3 of the braided piezoelectric element 1 to an input terminal of the amplification means 13, while the conductive layer 4 of the braided piezoelectric element 1, or the conductive fiber 10 of the fabric-like piezoelectric element 7, or a braided piezoelectric element that is separate from the braided piezoelectric element 1 connected to the input terminal of the amplification means 13, is connected to a ground (earth) terminal. For example, as shown in FIG. 13, in the fabric-like piezoelectric element 7, a lead wire from the core 3 of the braided piezoelectric element 1 is connected to the input terminal of the amplification means 13, and the conductive layer 4 of the braided piezoelectric element 1 is grounded (earthed). The ground (earth) may be the conductive fiber 10 in crossing contact with the braided piezoelectric element 1, instead of the conductive layer 4 of the braided piezoelectric element 1. Alternatively, when multiple braided piezoelectric elements 1 are arranged in the fabric-like piezoelectric element 7 as shown in FIG. 15, for example, one lead wire from the core 3 of one braided piezoelectric element 1 is connected to the input terminal of the amplification means 13, while a lead wire from the core 3 of another braided piezoelectric element 1 alongside the braided piezoelectric element 1 is grounded (earthed).

Since the device 11 of the invention is flexible and may be used in any form such as braided or fabric-like, it has a very wide range of potential uses. Specific examples for the device 11 of the invention are clothing, including caps, gloves and socks, touch panels in the form of supporters or handkerchiefs, and surface pressure-sensitive sensors for humans or animals, such as sensors that detect bending, twisting or stretching of the joint sections of gloves or bands or supporters, for example. When used for a human, for example, it may be used as an interface for detection of contact or movement and collection of data regarding movement of a joint being used for medical purposes, or for amusement, or for movement of lost tissue or a robot. In addition, it may be used as a surface pressure-sensitive sensor in a stuffed doll simulating an animal or human form, or a robot, or as a sensor for sensing of bending, twisting or stretching of joints. It may still further be used as a surface pressure-sensitive sensor or shape deformation sensor in beddings such as sheets or pillows, shoe soles, gloves, chairs, mats, bags, flags or the like.

In addition, since the device 11 of the invention is in braided or fabric form and is flexible, it may be used as a surface pressure-sensitive sensor or shape deformation sensor by attachment or covering on the surface of all or portions of various structures.

Furthermore, since the device 11 of the invention can generate a sufficient electrical signal simply by rubbing the surface of the braided piezoelectric element 1, it can be used in touch input devices such as touch sensors, or in pointing devices. Moreover, since positional information and shape information in the height direction of an object to be measured can be obtained by rubbing the surface of the object to be measured with the braided piezoelectric element 1, it can be used in surface form measurement and the like.

EXAMPLES

The present invention will now be described in greater detail by examples, with the understanding that the invention is not in any way restricted by the examples.

The piezoelectric element fabric was produced by the following method.
(Production of Polylactic Acid)

The polylactic acid used in the examples was produced by the following method.

After adding 0.005 part by mass of tin octylate to 100 parts by mass of L-lactide (product of Musashino Chemical Laboratory, Co. Ltd., 100% optical purity), the mixture was reacted at 180° C. for 2 hours in a stirring blade-equipped reactor under a nitrogen atmosphere, and phosphoric acid was added at 1.2 equivalents with respect to the tin octylate, after which the remaining lactide was removed under reduced pressure at 13.3 Pa, and chips were formed to obtain poly-L-lactic acid (PLLA1). The weight-average molecular weight of the obtained PLLA1 was 152,000, the glass transition point (Tg) was 55° C. and the melting point was 175° C.
(Piezoelectric Fibers)

PLLA1 melted at 240° C. was discharged from a 24-hole cap at 20 g/min, and drawn out at 887 m/min. The unstretched multifilament thread was stretched to a factor of 2.3 at 80° C. and heat set at 100° C., to obtain an 84 dTex/24 filament multifilament uniaxial stretched thread, which was used as piezoelectric fiber A.
(Conductive Fiber)

Silver plated nylon "AGposs" 100d34f by Mitsufuji Corp. was used as the conductive fiber B. The volume resistivity of the fiber was $1.1 \times 10^{-3}$ Ω·cm.
(Insulating Fiber)

Polyethylene terephthalate melted at 280° C. was discharged from a 24-hole cap at 45 g/min, and drawn out at 800 m/min. The unstretched filament was stretched to a factor of 2.5 at 80° C. and heat set at 180° C. to obtain an 84 dTex/24 filament multifilament drawn thread, which was used as the insulating fiber 9.
(Braided Piezoelectric Element Containing No Conductive Layer)

As the sample for Example 1, the conductive fiber B was used as the core thread and the eight piezoelectric fibers A were coiled in a braided form around the core thread, as shown in FIG. 1, to create an 8-plaited braid, forming a braided piezoelectric element. Using an SH connector contact by JST Mfg. Co., Ltd, as the metal terminal along the middle of the braided piezoelectric element, the 0.4 mm-long portion and the 0.8 mm-long hook portion were bent and the braided piezoelectric element was grasped, and then a soldering iron was contacted with the metal terminal and heated to fuse a portion of the sheath at the grasping portion. Conduction between the core and the metal terminal at the end of the braided piezoelectric element was confirmed, and the excess braided piezoelectric element at the tip was cut off from the grasping portion. The terminal-bearing braided piezoelectric element was used as a braided piezoelectric element 100.

For the sample of Example 2, the braided piezoelectric element used in Example 1 was cut and "DOTITE®" D-363 (product of Fujikura Kasei Co., Ltd.) was adhered onto the end as a conductive paste and solidified, after which an SH connector contact by JST Mfg. Co., Ltd. was used as a metal terminal, and the 0.4 mm-long portion and the 0.8 mm-long hook portion were bent and the conductive paste-adhered end of the braided piezoelectric element was grasped. Conduction between the core and metal terminal at the other end of the braided piezoelectric element was confirmed. The terminal-bearing braided piezoelectric element was used as a braided piezoelectric element 200.

For the sample of Example 3, insulating fiber was used as warp thread and weft thread of a plain woven fabric, two of the braided piezoelectric elements used in Example 1 were arranged as weft thread for the plain woven fabric, fork-shaped metal portions were each inserted along the middle sections of the braided piezoelectric elements, with two of ten XG pressure welding connectors by Omron Corp. as metal terminals, and braided piezoelectric elements were sandwiched by the upper section of the connector housing fixed to the metal portion and the corresponding lower section, and fixed. Conduction between the core and metal terminal at the end of each braided piezoelectric element was confirmed. The two terminal-bearing braided piezoelectric elements were used as braided piezoelectric elements 300 and 400, respectively. The braided piezoelectric elements were fixed by the warp thread of the plain woven fabric, the distance between the metal terminal and the warp thread of the plain woven fabric being 0.1 mm.

For the sample of Comparative Example 1, the sheath at the end of the braided piezoelectric element used in Example 1 was loosened to expose 1 mm of the core, and with an SH connector contact by JST Mfg. Co., Ltd. as a metal terminal, the hook was bent and the braided piezoelectric element grasped, so that the portion where the sheath had not been removed was grasped by a 0.4 mm-long hook portion and the exposed core was grasped by a 0.8 mm-long hook portion. Conduction between the core and metal terminal at the other end of the braided piezoelectric element was confirmed. The terminal-bearing braided piezoelectric element was used as a braided piezoelectric element 500.
(Performance Evaluation and Evaluation Results)

The performance evaluation and evaluation results for the braided piezoelectric elements 100, 200, 300, 400 and 500 are described below.

Example 1

Using the conductive fiber B in the braided piezoelectric element 100 as a signal wire, an oscilloscope (Digital Oscilloscope DL6000 Series "DL6000", trade name of Yokogawa Electric Corp.) was connected through the wire via a 1000-fold amplification circuit. The braided piezoelectric element 100 was bent 90 degrees in an electromagnetic shield box protected by a grounded (earthed) metallic gold net.

As a result, a difference in potential of approximately 100 mV was detected by the oscilloscope as the output from the braided piezoelectric element 100, confirming that a sufficiently large electrical signal could be detected by deformation of the braided piezoelectric element 100. At the end of the grasping portion, 0% of the piezoelectric fibers were separated from the core by loosening of the sheath structure.

Example 2

Evaluation was performed in the same manner as Example 1, using conductive fiber B in a braided piezoelectric element 200 as the signal wire. As a result, a difference in potential of approximately 100 mV was detected by the oscilloscope as the output from the braided piezoelectric element 200, confirming that a sufficiently large electrical signal could be detected by deformation of the braided piezoelectric element 200. At the end of the grasping portion and the silver paste-anchored portion, 0% of the piezoelectric fibers were separated from the core by loosening of the sheath structure.

Example 3

Using the conductive fibers B in the braided piezoelectric elements 300 and 400 as signal wires, an oscilloscope (Digital Oscilloscope DL6000 Series "DL6000", trade name of Yokogawa Electric Corp.) was connected through the wire via a 1000-fold amplification circuit. The fabrics in which the braided piezoelectric elements 300 and 400 were woven were bent 90 degrees in an electromagnetic shield box protected by a grounded (earthed) metallic gold net.

As a result, a difference in potential of approximately 100 mV was detected by the oscilloscope as the output from the braided piezoelectric elements 300 and 400, confirming that a sufficiently large electrical signal could be detected by deformation of the braided piezoelectric elements 300 and 400. At the edges of the fork-shaped metal portions, 0% of the piezoelectric fibers of the two braided piezoelectric elements had separated from the core by loosening of the sheath structure.

Comparative Example 1

Evaluation was performed in the same manner as Example 1, using conductive fiber B in a braided piezoelectric element 500 as the signal wire. As a result, a difference in potential of approximately 100 mV was detected by the oscilloscope, as the output from the braided piezoelectric element 500, but noise with an amplitude of about 10 mV was superimposed on the signal near the peak, confirming generation of noise due to the bending action. At the end of the grasping portion, 75% of the piezoelectric fibers were separated from the core by loosening of the sheath structure. (Braided Piezoelectric Element Containing Conductive Layer)

As the sample for Example 4, the conductive fiber B was used as the core thread and the eight piezoelectric fibers A were coiled in a braided form around the core thread, as shown in FIG. 2, to create an 8-plaited braid, and the conductive fiber 6 was further coiled around the piezoelectric fiber A of the sheath in a 8-plaited braided form to create a conductive layer 4, thus forming a braided piezoelectric element 1. The coiling angle α of the piezoelectric fiber A was 45° with respect to the fiber axis CL of the conductive fiber B. The coverage factor of the conductive layer 4 of the sample of Example 1 was 100%, The braided piezoelectric element was cut and the conductive fibers 6 composing the conductive layer 4 at a 10 mm end section were loosened and separated from the piezoelectric fibers A and conductive fiber B, after which, using aft SH connector contact by JST Mfg. Co., Ltd. as the signal metal terminal, a 0.4 mm-long portion and a 0.8 mm-long hook portion were bent and the piezoelectric fibers A and conductive fiber B remaining at the end of the braided piezoelectric element were grasped, and then a soldering iron was contacted with the signal metal terminal for heating to fuse a portion of the sheath at the grasping portion. Conduction between the core and the signal metal terminal at the end of the braided piezoelectric element was confirmed, and the excess braided piezoelectric element at the tip was cut off from the grasping portion. In addition, with a different SH connector contact by JST Mfg. Co., Ltd. as the shielding metal terminal, a 0.4 mm-long portion and a 0.8 mm-long hook portion were bent and the conductive fibers 6 separated from the piezoelectric fibers A and conductive fiber B were grasped. The conductive fibers 6 that could not grasp the shielding metal terminal and were separated from the piezoelectric fibers A were cut off. The signal metal terminal and shielding metal terminal were inserted into an SH connector housing 2P by JST Mfg. Co., Ltd. and fixed, and an insulating epoxy-based adhesive was adhered around the braided piezoelectric element 1 at 10 mm from the edge of the connector housing, to fix the SH connector and the braided piezoelectric element 1. The terminal-bearing braided piezoelectric element was used as a braided piezoelectric element 101.

As the sample for Example 5, the conductive fiber B was used as the core thread and the eight piezoelectric fibers A were coiled in a braided form around the core thread, as shown in FIG. 2, to create an 8-plaited braid, and four insulating fibers 9 were right-coiled while one conductive fiber 6 and three insulating fibers 9 were left-coiled around the piezoelectric fiber A of the sheath to create an 8-plait braided conductive layer 4, thus forming a braided piezoelectric element 1. The coiling angle α of the piezoelectric fiber A was 45° with respect to the fiber axis CL of the conductive fiber B. The coverage factor of the conductive layer 4 of the sample of Example 5 was 25%. In the same manner as Example 1, an SH connector contact by JST Mfg. Co., Ltd. as the signal metal terminal was connected to a conductive fiber B, a separate SH connector contact by JST Mfg. Co., Ltd. as a shielding metal terminal was connected to a conductive fiber 6, the signal metal terminal and shielding metal terminal were inserted into an SH connector housing 2P by JST Mfg. Co., Ltd. and fixed, and an insulating epoxy-based adhesive was adhered around the braided piezoelectric element 1 at 10 mm from the edge of the connector housing, to fix the SH connector and the braided piezoelectric element 1. The terminal-bearing braided piezoelectric element was used as a braided piezoelectric element 102.

For the sample of Example 6, the terminal-unconnected braided piezoelectric element 1 used in Example 1 was cut, the conductive fibers 6 forming the conductive layer 4 at a 10 mm end section were loosened and separated from the piezoelectric fibers A and conductive fiber B, "DOTITE®" D-363 (product of Fujikura Kasei Co., Ltd.) as a conductive paste was adhered onto the piezoelectric fibers A and conductive fiber B remaining at the end of the braided piezoelectric element and solidified, after which an SH connector contact by JST Mfg. Co., Ltd. was used as the signal metal terminal, and the 0.4 mm-long portion and the 0.8 mm-long hook portion were bent and the conductive paste-adhered end of the braided piezoelectric element was grasped. Conduction between the core and signal metal terminal at the other end of the braided piezoelectric element was confirmed. In addition, with a different SH connector contact by JST Mfg. Co., Ltd. as the shielding metal terminal, a 0.4 mm-long portion and a 0.8 mm-long hook portion were bent and the conductive fibers 6 separated from the piezoelectric fibers A and conductive fiber B was grasped, and the conductive fibers 6 that could not grasp the shielding metal terminal and were separated from the piezoelectric fibers A were cut off. The signal metal terminal and shielding metal terminal were inserted into an SH connector housing 2P by JST Mfg. Co., Ltd, and fixed, and an epoxy-based adhesive was adhered around the braided piezoelectric element 1 at 10 mm from the edge of the connector housing, to fix the SH connector and the braided piezoelectric element 1. The terminal-bearing braided piezoelectric element was used as a braided piezoelectric element 103.

For the sample of Example 7, the terminal-unconnected braided piezoelectric element 1 used in Example 1 was cut, the conductive fibers 6 forming the conductive layer 4 at a 10 mm end section were loosened and separated from the piezoelectric fibers A and conductive fiber B, "DOTITE®" D-363 (product of Fujikura Kasei Co., Ltd.) as a conductive paste was adhered onto the piezoelectric fibers A and conductive fiber B remaining at the end of the braided piezoelectric element and inserted 2 mm into the central contact of an SMA-P coaxial connector, and solidified, to form a signal metal terminal, and conduction between the core and the signal metal terminal at the other end of the braided piezoelectric element was confirmed. Also, using the metal exterior package of an SMA-P coaxial connector as the shielding metal terminal, the conductive fibers 6 that had separated from the piezoelectric fibers A and conductive fiber B were gripped by the sleeve and connected and fixed, while the conductive fibers 6 that could not grip the shielding metal terminal and separated from the piezoelectric fibers A were cut off. The terminal-bearing braided piezoelectric element wherein the signal metal terminal and shielding metal terminal had become integrated via the insulator as described above was used as the braided piezoelectric element 104. The SMA-P connector used for this example has a construction wherein the shielding metal terminal (exterior package) in the left side view completely covers the signal metal terminal (central contact).

As the sample for Example 8, insulating fibers 9 and two braided piezoelectric elements 1 (the same terminal-unconnected sample as Example 4) were arranged as warp threads, and insulating fibers 9 and conductive fibers 10 were arranged alternately as weft threads, as shown in FIG. 15, to form a plain weave fabric as the fabric-like piezoelectric element 7. After loosening the conductive fibers 6 forming the conductive layer 4 at 10 mm from the end of the two braided piezoelectric elements 1 in the fabric-like piezoelectric element 7, and separating them from the piezoelectric fibers A and conductive fiber B, the fork-shaped metal portions of two of the ten XG pressure welding connectors by Omron Corp. were each inserted into the portions where the piezoelectric fibers A were exposed, to form a signal metal terminal, while at the same time collecting the conductive fibers 6 separated from the piezoelectric fibers A and conductive fiber B, and the fork-shaped metal portion of one of the ten pressure welding connectors was inserted into the conductive fiber bundle, to form a shielding metal terminal. Also, the braided piezoelectric element was sandwiched and fixed by the upper section of the connector housing fixed to the metal portion, and the corresponding lower section. Conduction between the cores at the ends of two braided piezoelectric elements 1 and two signal metal terminals, and conduction between the conductive layers 4 of the braided piezoelectric elements 1 and one shielding metal terminal, were confirmed, and insulation between the two signal metal terminals and the one shielding metal terminal was confirmed. The two signal metal terminal-bearing braided piezoelectric elements were used as braided piezoelectric element 105-1 and 105-2, respectively. The braided piezoelectric elements were fixed by the warp thread of the plain woven fabric, the distance between the signal metal terminal and the warp thread of the plain woven fabric being 0.1 mm.

For the sample of Example 9, the terminal-unconnected braided piezoelectric element 1 used in Example 1 was cut, the conductive fibers 6 forming the conductive layer 4 at a 10 mm end section were loosened and separated from the piezoelectric fibers A and conductive fiber B and the piezoelectric fibers A at the end were further loosened to expose 1 mm of the core, and then with an SH connector contact by JST Mfg. Co., Ltd. as a signal metal terminal, the hook was bent and the braided piezoelectric element grasped, so that the portion where the sheath had not been removed was grasped by a 0.4 mm-long hook portion and the exposed core was grasped by a 0.8 mm-long hook portion. Conduction between the core and signal metal terminal at the other end of the braided piezoelectric element was confirmed. In addition, with a different SH connector contact by JST Mfg. Co., Ltd. as the shielding metal terminal, a 0.4 mm-long portion and a 0.8 mm-long hook portion were bent and the conductive fibers 6 separated from the piezoelectric fibers A and conductive fiber B were grasped, while the conductive fibers 6 that could not grasp the shielding metal terminal and were separated from the piezoelectric fibers A were cut off. The signal metal terminal and shielding metal terminal were inserted into an SH connector housing 2P by JST Mfg. Co., Ltd. and fixed. The terminal-bearing braided piezoelectric element was used as a braided piezoelectric element 106.

For the sample of Comparative Example 2, the terminal-unconnected braided piezoelectric element 1 used in Example 4 was cut, the conductive fibers 6 forming the conductive layer 4 at a 10 mm end section were loosened and separated from the piezoelectric fibers A and conductive fiber B, "DOTITE®" D-363 (product of Fujikura Kasei Co., Ltd.) as a conductive paste was adhered onto the piezoelectric fibers A and conductive fiber B remaining at the end of the braided piezoelectric element and solidified, after which an SH connector contact by JST Mfg. Co., Ltd. was used as the signal metal terminal, and the 0.4 mm-long portion and the 0.8 mm-long hook portion were bent and the conductive paste-adhered end of the braided piezoelectric element was grasped. Conduction between the core and signal metal terminal at the other end of the braided piezoelectric element was confirmed. In addition, with a different SH connector contact by JST Mfg. Co., Ltd. as the shielding metal terminal, a 0.4 mm-long portion and a 0.8 mm-long hook portion were bent and the conductive fibers 6 separated from the piezoelectric fibers A and conductive fiber B were grasped, while the conductive fibers 6 that could not grasp the shielding metal terminal and were separated from the piezoelectric fibers A were cut off. The signal metal terminal and shielding metal terminal were respectively inserted into two SH connector housings 2P by JST Mfg. Co., Ltd. and fixed, and an epoxy-based adhesive was adhered around the braided piezoelectric element 1 at 10 mm from the edge of the connector housing, to fix each SH connector and the braided piezoelectric element 1. The terminal-bearing braided piezoelectric element was used as a braided piezoelectric element 201.

As the sample for Comparative Example 3, the conductive fiber B was used as the core thread and the eight piezoelectric fibers A were coiled in a braided form around the core thread, in the same manner as Example 4, to create an 8-plaited braid, but without forming a conductive layer 4, to form a braided piezoelectric element. The coiling angle α of the piezoelectric fiber A was 45° with respect to the fiber axis CL of the conductive fiber B. After adhering "DOT-ITE®" D-363 (product of Fujikura Kasei Co., Ltd.) as a conductive paste to the piezoelectric fibers A and conductive fiber B at the end of the braided piezoelectric element, and solidifying it, an SH connector contact by JST Mfg. Co., Ltd. was used as a signal metal terminal, and the 0.4 mm-long portion and 0.8 mm-long hook portion were bent and the conductive paste-adhered end of the braided piezoelectric element was grasped. Conduction between the core and signal metal terminal at the other end of the braided piezoelectric element was confirmed. The signal metal terminal was inserted into an SH connector housing 2P by JST Mfg. Co., Ltd. and fixed, and an epoxy-based adhesive was adhered around the braided piezoelectric element 1 at 10 mm from the edge of the connector housing, to fix the SH connector and the braided piezoelectric element 1. The terminal-bearing braided piezoelectric element was used as a braided piezoelectric element 202.

(Performance Evaluation and Evaluation Results)

The performance evaluation and evaluation results for the braided piezoelectric elements 101, 102, 103, 104, 105-1, 105-2, 106, 201 and 202 are described below.

Example 4

An SH Connector housing by JST Mfg. Co., Ltd., wherein the signal metal terminal and shielding metal terminal were fixed in the braided piezoelectric element 101, was connected to an SH connector base 2P by JST Mfg. Co., Ltd., and the signal metal terminal was connected to an oscilloscope (Digital Oscilloscope DL6000 Series "DL6000", trade name of Yokogawa Electric Corp.) through a wire via a 1000-fold amplification circuit, in such a manner that the shielding metal terminal of the braided piezoelectric element 1 was grounded (earthed). Connection to braided piezoelectric element 101 and the measuring circuit and earth was made as a unit using an SH connector. Also, at the end of the grasping portion of the signal metal terminal, 0% of the piezoelectric fibers were separated from the core by loosening of the sheath structure.

As a result of bending the braided piezoelectric element 101 90°, a difference in potential of approximately 100 mV was detected by the oscilloscope as the output from the braided piezoelectric element 101, confirming that a sufficiently large electrical signal could be detected by deformation of the braided piezoelectric element 1. Also, the noise signal at rest was 20 mV and the S/N ratio was 5, demonstrating that noise signals were adequately suppressed.

Example 5

An SH Connector housing by JST Mfg. Co., Ltd., wherein the signal metal terminal and shielding metal terminal were fixed in the braided piezoelectric element 102, was connected to art SH connector base 2P by JST Mfg. Co., Ltd., and the signal metal terminal was connected to an oscilloscope (Digital Oscilloscope DL6000 Series "DL6000", trade name of Yokogawa Electric Corp.) through a wire via a 1000-fold amplification circuit, in such a manner that the shielding metal terminal of the braided piezoelectric element 1 was grounded (earthed). Connection to braided piezoelectric element 102 and the measuring circuit and earth was made as a unit using an SR connector. Also, at the end of the grasping portion of the signal metal terminal, 0% of the piezoelectric fibers were separated from the core by loosening of the sheath structure.

As a result of bending the braided piezoelectric element 102 90°, a difference in potential of approximately 100 mV was detected by the oscilloscope as the output from the braided piezoelectric element 102, confirming that a sufficiently large electrical signal could be detected by deformation of the braided piezoelectric element 1. Also, the noise signal at rest was 20 mV and the S/N ratio was 5, demonstrating that noise signals were adequately suppressed.

Example 6

An SH Connector housing by JST Mfg. Co., Ltd., wherein the signal metal terminal and shielding metal terminal were fixed in the braided piezoelectric element 103, was connected to art SH connector base 2P by JST Mfg. Co., Ltd., and the signal metal terminal was connected to an oscilloscope (Digital Oscilloscope DL6000 Series "DL6000", trade name of Yokogawa Electric Corp.) through a wire via a 1000-fold amplification circuit, in such a manner that the shielding metal terminal of the braided piezoelectric element 1 was grounded (earthed). Connection to braided piezoelectric element 103 and the measuring circuit and earth was made as a unit using an SH connector. Also, at the end of the grasping portion of the signal metal terminal, 0% of the piezoelectric fibers were separated from the core by loosening of the sheath structure.

As a result of bending the braided piezoelectric element 103 90°, a difference in potential of approximately 100 mV was detected by the oscilloscope as the output from the braided piezoelectric element 103, confirming that a sufficiently large electrical signal could be detected by deformation of the braided piezoelectric element 1. Also, the noise signal at rest was 20 mV and the S/N ratio was 5, demonstrating that noise signals were adequately suppressed.

Example 7

An SMA-P coaxial connector, with a signal metal terminal and shielding metal terminal fixed in a braided piezoelectric element 104, was connected to an SMA-J coaxial connector, and the signal metal terminal was connected to an oscilloscope (Digital Oscilloscope DL6000 Series "DL6000", trade name of Yokogawa Electric Corp.) through a wire via a 1000-fold amplification circuit, in such a manner that the shielding metal terminal of the braided piezoelectric element 1 was grounded (earthed). Connection to braided piezoelectric element 104 and the measuring circuit and earth was made as a unit using an SMA connector. Also, at the end of the grasping portion of the signal metal terminal, 0% of the piezoelectric fibers were separated from the core by loosening of the sheath structure.

As a result of bending the braided piezoelectric element 104 90°, a difference in potential of approximately 100 mV was detected by the oscilloscope as the output from the braided piezoelectric element 104, confirming that a sufficiently large electrical signal could be detected by deformation of the braided piezoelectric element 1. Also, the noise signal at rest was 16 mV and the S/N ratio was 6, demonstrating that noise signals were adequately suppressed.

Example 8

An XG pressure welding connector by Omron Corp., with the signal metal terminal and shielding metal terminal of the braided piezoelectric element 105-1 and braided piezoelectric element 105-2 fixed, was connected to a 2 row×5 line pin header, and the signal metal terminal was connected to an oscilloscope (Digital Oscilloscope DL6000 Series "DL6000", trade name of Yokogawa Electric Corp.) through a wire via a 1000-fold amplification circuit, in such a manner that the shielding metal terminal of the braided piezoelectric element 1 was grounded (earthed). Connection to braided piezoelectric element 105-1 and braided piezoelectric element 105-2 and the measuring circuit and earth was made as a unit using an XG pressure welding connector. Also, at the edges of the fork-shaped metal portion of the signal metal terminal, 0% of the piezoelectric fibers of the two braided piezoelectric elements had separated from the core by loosening of the sheath structure, in both the braided piezoelectric element 105-1 and the braided piezoelectric element 105-2.

As a result of bending the braided piezoelectric element 105-1 and braided piezoelectric element 105-2 90° by bending the fabric-like piezoelectric element 7, differences in potential of approximately 100 mV were detected by the oscilloscope as the respective outputs from the braided piezoelectric element 105-1 and braided piezoelectric element 105-2, confirming that a sufficiently large electrical signal could be detected by deformation of the braided piezoelectric element 1. Also, the noise signal at rest was 20 mV and the S/N ratio was 5, demonstrating that noise signals were adequately suppressed.

Example 9

An SH Connector housing by JST Mfg. Co., Ltd., wherein the signal metal terminal and shielding metal terminal were fixed in the braided piezoelectric element 106, was connected to an SH connector base 2P by JST Mfg. Co., Ltd., and the signal metal terminal was connected to an oscilloscope (Digital Oscilloscope DL6000 Series "DL6000", trade name of Yokogawa Electric Corp.) through a wire via a 1000-fold amplification circuit, in such a manner that the shielding metal terminal of the braided piezoelectric element 1 was grounded (earthed). Connection to braided piezoelectric element 106 and the measuring circuit and earth was made as a unit using an SH connector. Also, at the end of the grasping portion of the signal metal terminal, 75% of the piezoelectric fibers were separated from the core by loosening of the sheath structure.

As a result of bending the braided piezoelectric element 106 90°, a difference in potential of approximately 100 mV was detected by the oscilloscope, as the output from the braided piezoelectric element 106, but noise with an amplitude of about 30 mV was superimposed on the signal near the peak, confirming generation of noise due to the bending action. Also, the noise signal at rest was 20 mV and the S/N ratio was 5, demonstrating that noise signals were adequately suppressed.

Comparative Example 2

An SH Connector housing by JST Mfg. Co., Ltd. wherein the signal metal terminal was fixed in the braided piezoelectric element 201, and an SH connector housing by JST Mfg. Co., Ltd. wherein the shielding metal terminal was fixed, were each connected to an SH connector base 2P by JST Mfg. Co., Ltd., and the signal metal terminal was connected to an oscilloscope (Digital Oscilloscope DL6000 Series "DL6000", trade name of Yokogawa Electric Corp.) through a wire via a 1000-fold amplification circuit, in such a manner that the shielding metal terminal of the braided piezoelectric element 1 was grounded (earthed). Since connection between the braided piezoelectric element 201 and the measuring circuit and earth was made separately by two sets of SH connectors, the conductive fibers 6 pulled by the shielding metal terminal underwent fraying. Also, at the end of the grasping portion of the signal metal terminal, 0% of the piezoelectric fibers were separated from the core by loosening of the sheath structure.

As a result of bending the braided piezoelectric element 201 90°, a difference in potential of approximately 100 mV was detected by the oscilloscope as the output from the braided piezoelectric element 201, confirming that a sufficiently large electrical signal could be detected by deformation of the braided piezoelectric element 1. Also, the noise signal at rest was 25 mV and the S/N ratio was 4, and therefore noise signals could not be adequately suppressed.

Comparative Example 3

An SH Connector housing by JST Mfg. Co., Ltd., wherein the signal metal terminal was fixed in the braided piezoelectric element 202, was connected to an SH connector base 2P by JST Mfg. Co., Ltd., and when the signal metal terminal was connected to an oscilloscope (Digital Oscilloscope DL6000 Series "DL6000", trade name of Yokogawa Electric Corp.) through a wire via a 1000-fold amplification circuit, the noise signal at rest was 1000 mV. The braided piezoelectric element 202 was bent 90 degrees, but the noise signal was large and it was not possible to discriminate the electrical signal from bending. Also, at the end of the grasping portion of the signal metal terminal, 0% of the piezoelectric fibers were separated from the core by loosening of the sheath structure.

REFERENCE SIGNS LIST

A Piezoelectric fiber
B Conductive fiber
CL Fiber axis
α Coiling angle
1 Braided piezoelectric element
2 Sheath
3 Core
4 Conductive layer
6 Conductive fiber
7 Fabric-like piezoelectric element
8 Fabric
9 Insulating fiber
10 Conductive fiber
11 Device
12 Piezoelectric element
13 Amplification means
14 Output means
15 Transmission means
20 Metal terminal
21, 31 Grasping portion
22 Connector housing
23, 33 Opening
25, 35 Fork-shaped portion 26, 36 Needle-shaped portion
30 Signal metal terminal
32 Insulator
34 Shielding metal terminal
100 Plain weave fabric

The invention claimed is:
1. A braided piezoelectric element comprising:
a core formed of a conductive fiber, and
a sheath formed of braided piezoelectric fibers in a manner covering the core,
wherein the core of the braided piezoelectric element further comprises a metal terminal connected and fixed in either of the following states A or B, and the edge of the portion of the braided piezoelectric element that is secured by the metal terminal or a component fixed to the metal terminal has a section where piezoelectric fibers resulting by loosening of the sheath structure and separation from the core are less than 20% of the total piezoelectric fibers of the sheath;
A) A state in which a portion of the metal terminal grasps a 0.5 mm-long or greater portion of fibers constituting the end of the braided piezoelectric element, and the core and the metal terminal of the braided piezoelectric element are electrically connected to each other either directly or indirectly via a conducting material, and fixed, at the grasping portion or at a location within 1 mm from the grasping portion;
B) A state in which a portion of the metal terminal has a fork or needle shape, the fork-shaped or needle-shaped portion is connected to the conductive fiber of the core either directly or indirectly via a conducting material, while in contact with the sheath of the braided piezoelectric element, and the braided piezoelectric element is secured to the metal terminal by another portion of the metal terminal or a component fixed to the metal terminal within 10 mm from the point of the connection.

2. The braided piezoelectric element according to claim 1, wherein all or some of the piezoelectric fibers of the sheath within 5 mm from the connected portion between the core and the metal terminal have lost their fiber shapes and are fused.

3. The braided piezoelectric element according to claim 1, wherein the surface of the sheath comprises a conducting material, which is composed of solder or a conductive paste and is electrically connected to the core, the core and the metal terminal being electrically connected in an indirect manner by contact between the metal terminal and the conducting material provided on the surface of the sheath.

4. A fabric-like piezoelectric element comprising a fabric that includes a braided piezoelectric element according to claim 1, wherein at least part of the braided piezoelectric element is fixed to a fabric-like base material within a length of 10 mm from the portion where the metal terminal is fixed to the braided piezoelectric element.

5. The braided piezoelectric element according to claim 1, wherein two or more braided piezoelectric elements according to claim 1 are situated roughly in parallel, the two or more metal terminals respectively connected to the braided piezoelectric elements being integrated into a single connector housing and being connectable as one unit to a separate connector.

6. A fabric-like piezoelectric element having two or more braided piezoelectric elements according to claim 5 situated roughly in parallel, in a portion of the yarns composing a woven fabric or knitted fabric.

7. The braided piezoelectric element according to claim 1, wherein
the piezoelectric fibers include polylactic acid as the main component, and
the coiling angle of the piezoelectric fibers with respect to the conductive fibers is between 15° and 75°, inclusive.

8. The braided or fabric like piezoelectric element according to claim 1, wherein
the total fineness of the piezoelectric fibers is at least 1 and no greater than 20 times the total fineness of the conductive fibers.

9. The braided piezoelectric element according claim 1, wherein the fineness per fiber of the piezoelectric fibers is at least 1/20 and no greater than 2 times the total fineness of the conductive fibers.

10. The fabric-like piezoelectric element according to claim 4, which further includes conductive fibers that cross and contact with at least part of the braided piezoelectric element.

11. The fabric-like piezoelectric element according to claim 10, wherein the conductive fibers constitute at least 30% of the fibers crossing the braided piezoelectric element.

12. A device comprising:
a braided piezoelectric element according to claim 1,
amplification means that amplifies an electrical signal outputted from the braided or fabric-like piezoelectric element in response to applied pressure, and
output means that outputs the electrical signal that has been amplified by the amplification means.

13. A piezoelectric element comprising:
a core formed of a conductive fiber,
a sheath formed of braided piezoelectric fibers, covering the core, and
a conductive layer provided on the periphery of the sheath,
wherein the piezoelectric element further comprises a signal metal terminal connected and fixed to the core, and a shielding metal terminal connected and fixed to the conductive layer, the signal metal terminal and the shielding metal terminal being fixed to each other via an insulator.

14. The piezoelectric element according to claim 13, wherein the coverage factor of the sheath by the conductive layer is 25% or greater.

15. The piezoelectric element according to claim 13, wherein the conductive layer is formed of fibers.

16. The piezoelectric element according to claim 13, wherein the shielding metal terminal covers and holds the signal metal terminal via an insulator.

17. The piezoelectric element according to claim 13, wherein the signal metal terminal is connected and fixed in either of the following states A or B, and the edge of the portion of the piezoelectric element that is secured by the signal metal terminal or a component fixed to the signal metal terminal has a section where piezoelectric fibers resulting by loosening of the sheath structure and separation from the core are less than 20% of the total piezoelectric fibers of the sheath;
A) A state in which a portion of the signal metal terminal grasps a 0.5 mm-long or greater portion of fibers constituting the end of the piezoelectric element, and the core and the signal metal terminal of the piezoelectric element are electrically connected to each other either directly or indirectly via a conducting material, and fixed, at the grasping portion or at a location within 1 mm from the grasping portion;

B) A state in which a portion of the signal metal terminal has a fork or needle shape, the fork-shaped or needle-shaped portion is connected to the conductive fiber of the core either directly or indirectly via a conducting material, while in contact with the sheath of the piezoelectric element, and the piezoelectric element is secured to the signal metal terminal by another portion of the signal metal terminal or a component fixed to the signal metal terminal within 10 mm from the point of the connection.

18. The piezoelectric element according to claim 13, wherein all or some of the piezoelectric fibers of the sheath within 5 mm from the connected portion between the core and the signal metal terminal have lost their fiber shapes and are fused.

19. The piezoelectric element according to claim 13, wherein the surface of the sheath comprises a conducting material, which is composed of solder or a conductive paste and is electrically connected to the core, the core and the signal metal terminal being electrically connected in an indirect manner by contact between the signal metal terminal and the conducting material provided on the surface of the sheath.

20. A piezoelectric element comprising a fabric that includes a piezoelectric element according to claim 13, wherein at least part of the piezoelectric element is fixed to a fabric-like base material within a length of 10 mm from the portion where the signal metal terminal or shielding metal terminal is fixed to the piezoelectric element.

21. The piezoelectric element according to claim 13, wherein two or more piezoelectric elements according to claim 13 are situated roughly in parallel, the two or more signal metal terminals respectively connected to the piezoelectric elements being integrated into a single connector housing and being connectable as one unit to a separate connector.

22. The piezoelectric element according to claim 21, wherein the two or more piezoelectric elements are situated roughly in parallel as a portion of the yarns composing a woven fabric or knitted fabric.

23. The piezoelectric element according to claim 13, wherein
the piezoelectric fibers include polylactic acid as the main component, and
the coiling angle of the piezoelectric fibers with respect to the conductive fibers is between 15° and 75°, inclusive.

24. The piezoelectric element according to claim 13, wherein
the total fineness of the piezoelectric fibers is at least 1 and no greater than 20 times the total fineness of the conductive fibers.

25. The piezoelectric element according to claim 13, wherein
the fineness per piezoelectric fiber is at least 1/20 and no greater than 2 times the total fineness of the conductive fibers.

26. The piezoelectric element according to claim 20, which further includes conductive fibers that cross and contact with at least part of the piezoelectric element.

27. The piezoelectric element according to claim 26, wherein the conductive fibers constitute at least 30% of the fibers crossing the piezoelectric element.

28. A device comprising:
a piezoelectric element according to claim 13,
amplification means that amplifies an electrical signal outputted from the piezoelectric element in response to applied pressure, and
output means that outputs the electrical signal that has been amplified by the amplification means.

* * * * *